US006663716B2

(12) United States Patent
Loan et al.

(10) Patent No.: US 6,663,716 B2
(45) Date of Patent: *Dec. 16, 2003

(54) FILM PROCESSING SYSTEM

(75) Inventors: James F. Loan, Mansfield, MA (US); Jack P. Salerno, Waban, MA (US)

(73) Assignee: CVD Systems, Inc., North Billerica, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,871

(22) Filed: Apr. 14, 1999

(65) Prior Publication Data

US 2001/0016364 A1 Aug. 23, 2001

Related U.S. Application Data

(63) Continuation-in-part of application No. 09/060,007, filed on Apr. 14, 1998.

(51) Int. Cl.[7] .................. C23C 16/00; G01R 31/26; H01L 21/66
(52) U.S. Cl. ........................ 118/726; 438/14
(58) Field of Search .................. 438/14; 118/715, 118/726, 666, 724, 725; 134/1; 422/112; 261/141

(56) References Cited

U.S. PATENT DOCUMENTS

| | | | |
|---|---|---|---|
| 3,969,449 A | 7/1976 | Shires et al. ............ 261/153 |
| 4,212,663 A * | 7/1980 | Aslami .................. 65/144 |
| 4,234,622 A | 11/1980 | DuBuske et al. ........ 427/45.1 |
| 4,404,236 A | 9/1983 | Komatsu et al. ........ 427/94 |
| 4,436,674 A | 3/1984 | McMenamin ........... 261/64 B |
| 4,487,787 A | 12/1984 | Shioya et al. .......... 427/8 |
| 4,495,889 A * | 1/1985 | Riley .................. 118/666 |
| 4,619,844 A | 10/1986 | Pierce et al. .......... 427/248.1 |
| 4,717,596 A | 1/1988 | Barbee et al. .......... 427/248.1 |
| 4,726,961 A | 2/1988 | Diem et al. ............ 437/245 |
| 4,842,827 A * | 6/1989 | Graf et al. ............ 422/112 |
| 4,844,006 A | 7/1989 | Page, Jr. et al. ........ 118/719 |
| 5,160,542 A | 11/1992 | Mihira et al. .......... 118/715 |

(List continued on next page.)

OTHER PUBLICATIONS

Sutcliffe et al., "Characterization and aluminum metallization of a parylene AF–4 surface", Appl. Surf. Sci., 126 (1998), 43.–56.*

(List continued on next page.)

Primary Examiner—John F. Niebling
Assistant Examiner—Viktor Simkovic
(74) Attorney, Agent, or Firm—Bowditch & Dewey, LLP

(57) ABSTRACT

An apparatus for chemical vapor deposition includes a dispenser for dispensing a precursor to a vaporizer positioned within a vaporization chamber. A delivery conduit joins the vaporization with a process chamber. A flow meter is positioned within the delivery conduit for measuring the flow of precursor through the delivery conduit. A flow controller is likewise positioned within the delivery conduit for controlling the flow of precursor in response to the measured flow rate.

32 Claims, 28 Drawing Sheets

U.S. PATENT DOCUMENTS

| | | | | |
|---|---|---|---|---|
| 5,201,995 A | | 4/1993 | Reisman et al. | 156/646 |
| 5,203,925 A | | 4/1993 | Shibuya et al. | 118/724 |
| 5,204,314 A | | 4/1993 | Kirlin et al. | 505/1 |
| 5,260,236 A | * | 11/1993 | Petro et al. | 437/241 |
| 5,306,666 A | | 4/1994 | Izumi | 437/192 |
| 5,322,710 A | | 6/1994 | Visser | 427/248.1 |
| 5,354,516 A | | 10/1994 | Tomita | 261/121.1 |
| 5,362,328 A | | 11/1994 | Gardiner et al. | 118/726 |
| 5,383,970 A | | 1/1995 | Asaba et al. | 118/726 |
| 5,399,200 A | | 3/1995 | Stauffer | 118/726 |
| 5,399,379 A | | 3/1995 | Sandhu | 427/255.2 |
| 5,451,258 A | | 9/1995 | Hillman et al. | 118/715 |
| 5,460,654 A | | 10/1995 | Kikkawa et al. | 118/726 |
| 5,492,724 A | | 2/1996 | Klinedinst et al. | 427/248.1 |
| 5,505,781 A | | 4/1996 | Omori et al. | 118/726 |
| 5,520,969 A | | 5/1996 | Nishizato et al. | 427/8 |
| 5,531,183 A | | 7/1996 | Sivaramakrishnam et al. | 117/93 |
| 5,558,720 A | * | 9/1996 | Sarraf et al. | 118/726 |
| 5,595,603 A | * | 1/1997 | Klinedinst et al. | 118/715 |
| 5,605,865 A | | 2/1997 | Maniar et al. | 437/200 |
| 5,614,247 A | | 3/1997 | Barbee et al. | 427/8 |
| 5,620,524 A | | 4/1997 | Fan et al. | 118/726 |
| 5,630,878 A | | 5/1997 | Miyamoto et al. | 118/715 |
| 5,645,642 A | | 7/1997 | Nishizato et al. | 118/692 |
| 5,652,431 A | | 7/1997 | DeSisto et al. | 250/373 |
| 5,653,806 A | | 8/1997 | Van Buskirk | 118/715 |
| 5,653,813 A | | 8/1997 | Benzing et al. | 118/726 |
| 5,660,895 A | | 8/1997 | Lee et al. | 427/579 |
| 5,669,979 A | * | 9/1997 | Elliot et al. | 134/1 |
| 5,674,574 A | | 10/1997 | Atwell et al. | 427/561 |
| 5,681,614 A | | 10/1997 | Omori et al. | 427/248.1 |
| 5,690,743 A | * | 11/1997 | Murakami et al. | 118/715 |
| 5,710,079 A | | 1/1998 | Sukharev | 438/778 |
| 5,728,222 A | | 3/1998 | Barbee et al. | 118/715 |
| 5,776,254 A | | 7/1998 | Yuuki et al. | 118/725 |
| 5,803,938 A | * | 9/1998 | Yamaguchi et al. | 55/257.7 |
| 5,835,678 A | | 11/1998 | Li et al. | 392/401 |
| 5,958,510 A | * | 9/1999 | Sivaramakrishnam et al. | 427/255.6 |
| 6,018,616 A | * | 1/2000 | Schaper | 392/418 |
| 6,019,848 A | * | 2/2000 | Frankel et al. | 118/715 |
| 6,244,575 B1 | * | 6/2001 | Vaarstra et al. | 261/141 |

OTHER PUBLICATIONS

Sutcliffe et al., "Characterization and aluminum metallization of a parylene AF–4 surface", Appl. Surf. Sci., 126 (1998), 43.–56.*

Sutcliffe et al., "Characterization and aluminum metallization of a parylene AF–4 surface", Appl. Surf. Sci., 126 (1998), 43.–56.*

Sutcliffe et al., "Characterization and aluminum metallization of a parylene AF–4 surface", Appl. Surf. Sci., 126 (1998), 43.–56.*

* cited by examiner

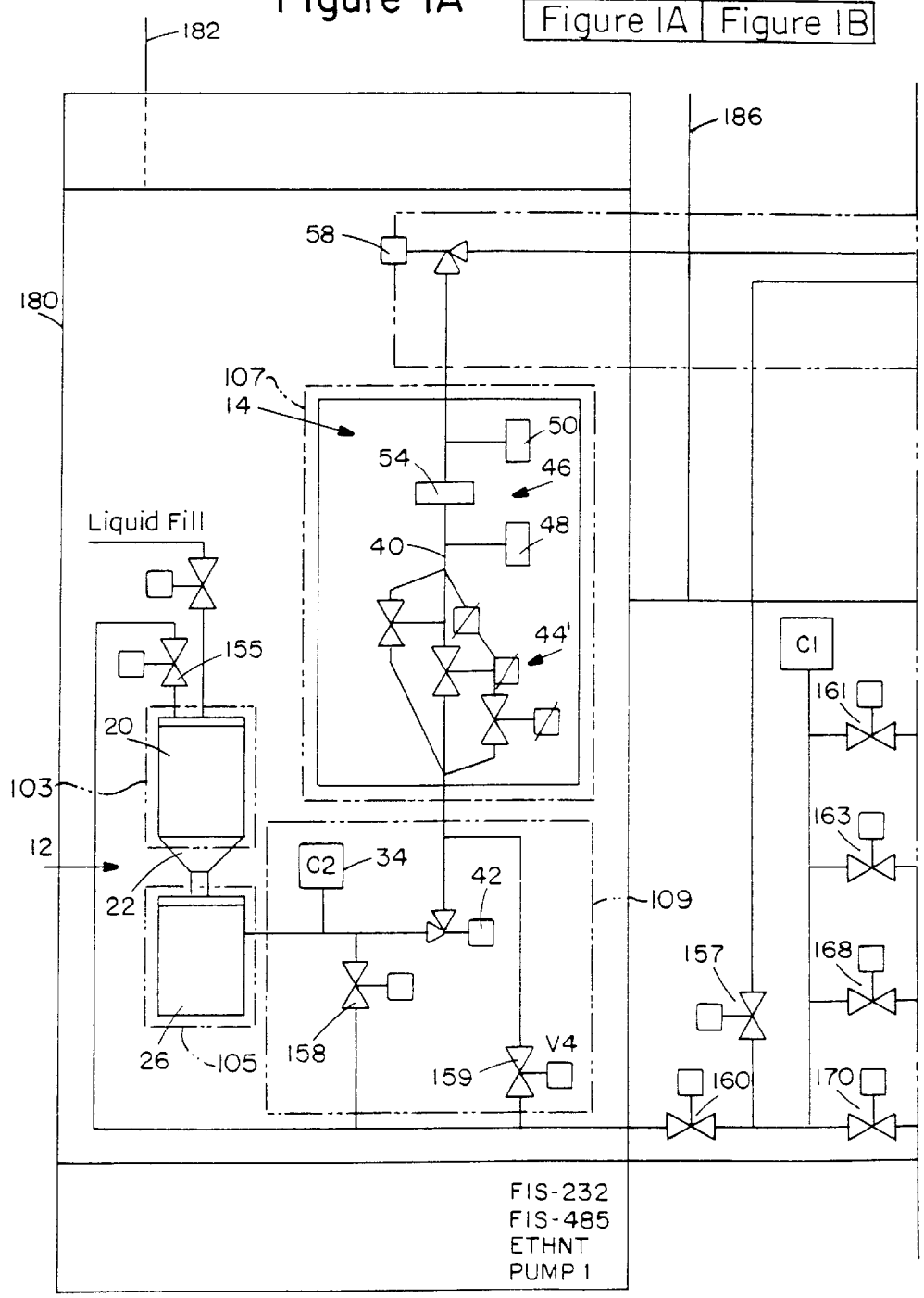

| Figure 1C | Figure 1D |

US 6,663,716 B2

FILM PROCESSING SYSTEM

RELATED APPLICATION

This is a continuation-in-part application of U.S. Ser. No. 09/060,007 filed on Apr. 14, 1998, the entire contents of which is incorporated herein by reference.

BACKGROUND OF THE INVENTION

Chemical vapor deposition (CVD) is a process of forming a film on a substrate, typically, by generating vapors from liquid or solid precursors and delivering those vapors to the surface of a heated substrate where the vapors react to form a film. Systems for chemical vapor deposition are employed in applications such as semiconductor fabrication, where CVD is employed to form thin films of semiconductors, dielectrics and metal layers. Three types of systems commonly used for performing CVD include bubbler-based systems, liquid-mass-flow-control systems, and direct-liquid-injection systems.

Bubbler-based systems, or "bubblers," essentially bubble a stream of gas through a heated volume of liquid precursor. As the stream of gas passes through the liquid precursor, vapors from the liquid precursor are absorbed into the gas stream. This mixture of gases is delivered to a process chamber, where the gases react upon a surface of a heated substrate. Bubblers typically heat the volume of liquid precursor at a constant temperature. Over time, the constant heat often causes the precursor to decompose rendering it useless for CVD. In an effort to minimize decomposition, the bubbler is typically maintained at a temperature lower than that at which the vapor pressure of the liquid precursor is optimal.

Liquid mass flow control systems attempt to deliver the precursor in its liquid phase to a vaporizer typically positioned near the substrate. The precursor is vaporized and is then typically entrained in a carrier gas which delivers it to the heated substrate. A liquid mass flow controller, which is a thermal mass flow controller adapted to control liquids, is used to measure and control the rate of flow of liquid precursor to the vaporizer.

Liquid mass flow controllers present a number of drawbacks. First, liquid mass flow controllers are extremely sensitive to particles and dissolved gases in the liquid precursor. Second, liquid mass flow controllers are also sensitive to variations in the temperature of the liquid precursor. Third, liquid mass flow controllers typically use a gas to assist in the vaporization of the liquid precursor, thereby increasing the probability of generating solid particles and aerosols and ensuring a high gas load in the process system. Fourth, most liquid mass flow controllers cannot operate at temperatures above 40° C., a temperature below which some precursor liquids, such as tantalum pentaethoxide (TAETO), have high viscosity. Due to its sensitivities, the liquid flow controller is accurate and repeatable to about 1% of full-scale liquid flow. Further, when a liquid mass flow controller wetted with TAETO or one of a number of other precursors is exposed to air, the precursor will generally react to produce a solid which may destroy the liquid flow controller.

Liquid pump-based systems pump the liquid precursor to the point of vaporization, typically at a position near the heated substrate. Liquid pump-based systems are generally one of two main types. One type uses a liquid flow meter in line with a high-pressure liquid pump. The other type uses a high-precision, high-pressure metering pump. Both of these systems are extremely sensitive to particles in the liquid. The liquid-flow-meter based system is also sensitive to gas dissolved in the liquid. Both are extremely complex to implement, and neither can tolerate high temperatures (maximum 50° C.). The system with the metering pump has difficulty vaporizing high viscosity liquids. Finally, both are generally difficult to implement in a manufacturing environment due to their extreme complexity and large size.

Existing CVD equipment design is generally optimized for high process pressures. The use of high process pressures is most likely due to the fact that, until recently, CVD precursors were either generally relatively high-vapor-pressure materials at room temperature or were, in fact, pressurized gases. Examples include tetraethyloxy silicate (TEOS), $TiCl_4$, Silane, and tungsten hexafluoride, etc. These materials were chosen because they had high vapor pressures and could therefore be easily delivered. The process pressure was generally well within the stable vapor pressure range of each of these materials.

DISCLOSURE OF THE INVENTION

The present invention relates to systems and methods for chemical vapor deposition for the fabrication of materials and structures for a variety of applications. The system is well suited for use in the fabrication of devices for the semiconductor industry, but can also be used in other applications involving thin film deposition and processing.

In addition to the fabrication of dielectric layers, metalization layers, and epitaxially grown semiconductor films including silicon, germanium, II–VI and III–V materials, the system can be used for precision manufacture of optical thin films such as anti-reflective coatings or stacked dielectric structures including optical filters, diamond thin films or composite structures for multichip modules or optoelectronic devices.

In contrast to thin films of traditional CVD materials, future thin films require new materials that have low vapor pressures and that are often near their decomposition temperature when heated to achieve an appropriate vapor pressure. Some of the precursors having both intrinsically low vapor pressure and low thermal decomposition temperature are considered the best choices for deposition of films of tantalum oxide, tantalum nitride, titanium nitride, copper, and aluminum.

An apparatus of this invention includes a vaporizer within a vaporization chamber and a dispenser positioned for dispensing a precursor to the vaporizer. A delivery conduit joins the vaporization chamber with a process chamber, where a chemical vapor is deposited on a substrate. A flow meter is positioned to measure vapor flow through the delivery conduit, and a flow controller is positioned to control vapor flow through the delivery conduit. Both the flow meter and flow controller are communicatively coupled with a processor programmed to control the flow controller to govern vapor flow through the delivery conduit in response to the measured vapor flow.

In a preferred embodiment, the flow meter includes a tube with a pair of open ends, which acts as a laminar flow element. The flow meter further includes a pair of capacitance manometers aligned with the open ends of the tube to measure the pressure drop across the laminar flow element. In a further preferred embodiment, the flow controller is a proportional control valve in communication with the flow meter.

A still further preferred embodiment of the apparatus includes a reservoir for supplying precursor to the dispenser. The dispenser is controlled by the processor and the vaporizer which receives precursor from the dispenser includes a heated surface for vaporizing the precursor. Preferably, a pressure sensor communicatively coupled with the processor is positioned in the vaporization chamber. Accordingly, the processor can, in some embodiments, control the rate at which vapor is generated by the vaporizer, by, for example, controlling the rate at which the dispenser dispenses precursor from the reservoir to the vaporizer.

In another embodiment of the apparatus, an outlet of the delivery conduit is positioned in the process chamber, and a showerhead divides the process chamber into an upstream section and a downstream section, wherein the outlet is in the upstream section and a substrate chuck is in the downstream section. An upstream pressure sensor is positioned to measure vapor pressure in the upstream section, and a downstream pressure sensor is positioned to measure vapor pressure in the downstream section. Both the upstream and downstream pressure sensors are communicatively coupled with a processor. In a further preferred embodiment, the showerhead is "active," enabling control over the vapor flow rate through the showerhead.

Other features found in preferred embodiments of the apparatus include a heater in thermal contact with the delivery conduit, a DC or AC source connected to the substrate chuck, and an elevator for raising and lowering the substrate chuck. Another embodiment of this invention is a cluster tool for semiconductor processing including a CVD apparatus, described above, connected to a central wafer handler.

In a method of this invention, a precursor is vaporized in a vaporization chamber, gas flow between the vaporization chamber and a process chamber is measured, and the rate of gas flow between the vaporization chamber is controlled in response to the measured gas flow. In another embodiment of a method of this invention, the vapor pressure of a precursor is measured, and the rate at which the precursor is vaporized is controlled in response to the measured vapor pressure, preferably by controlling the rate at which precursor is dispensed from a reservoir onto a vaporizer. Preferably, deposition occurs via a surface-driven reaction. Nevertheless, embodiments of the invention also cover methods where deposition occurs via non-surface driven reactions.

The systems and methods of this invention provide numerous benefits. First, they allow the precursor to be delivered to the substrate in a much purer and higher-pressure or high-flux form than is achievable with the use of systems that use a carrier gas. As a result, the likelihood of gas-phase reactions and consequent formation of particles can be greatly reduced. Because of the higher concentration, which leads to a higher deposition rate, this invention does not necessitate the introduction of plasma into the process chamber. Consequently, the apparatus is simplified, and plasma-induced polymerization of precursor is reduced or eliminated. Second, control over the concentration of precursor delivered to the process chamber is enhanced, thereby improving control over film thickness and uniformity. Third, the direct delivery of vapor flow into the process chamber at low temperature and low pressure and without a carrier gas increases the efficiency of use of costly precursors in many applications by a factor of up to 10 or more over standard systems utilizing a carrier gas, which infer precursor vapor flow rates either from a theoretical pickup rate, which is carrier-gas and temperature dependent, or from a thermal mass-flow controller or liquid delivery system. Likewise, emissions of unreacted process gases from the process chamber can be maintained at very low levels because the absence of a carrier gas and generally lower flow rates and better residence times leads to a higher utilization efficiency of the precursor. Fourth, decomposition of the precursor is limited due to its short contact time with the heated vaporizer. While small amounts of precursor are delivered to the vaporizer, as needed, the useful life of the bulk of the precursor is preserved by maintaining it at a lower temperature in the reservoir. Fifth, the highly conformal nature of deposits that can be formed by methods of this invention are useful in forming integrated circuits with line-widths of 0.25 microns (250 nm) or less.

Other advantages of this invention include the low sensitivity of the system to impurities such as dissolved gases and particles in the precursor, the relative ease of alternating between multiple precursors in a single system as a result of the ability to coordinate the use of each with a common precursor delivery system, the ease of accessing and maintaining all subsystems, the low power requirements of the system, the use of only low voltages in the operating elements of the system and the small overall size of the system.

BRIEF DESCRIPTION OF THE DRAWINGS

The foregoing and other objects, features and advantages of the invention will be apparent from the following, more particular description of preferred embodiments of the invention, as illustrated in the accompanying figures. The drawings are not necessarily to scale, emphasis instead being placed upon illustrating the principles of the invention.

FIGS. 1A and 1B provide a schematic illustration of an apparatus of this invention.

DETAILED DESCRIPTION OF PREFERRED EMBODIMENTS

The features and other details of the method of the invention will now be more particularly described with reference to the accompanying drawings and pointed out in the claims. Numbers that appear in more than one figure represent the same item. It will be understood that the particular embodiments of the invention are shown by way of illustration and not as limitations of the invention. The principle features of this invention can be employed in various embodiments without departing from the scope of the invention.

Figure 1B:
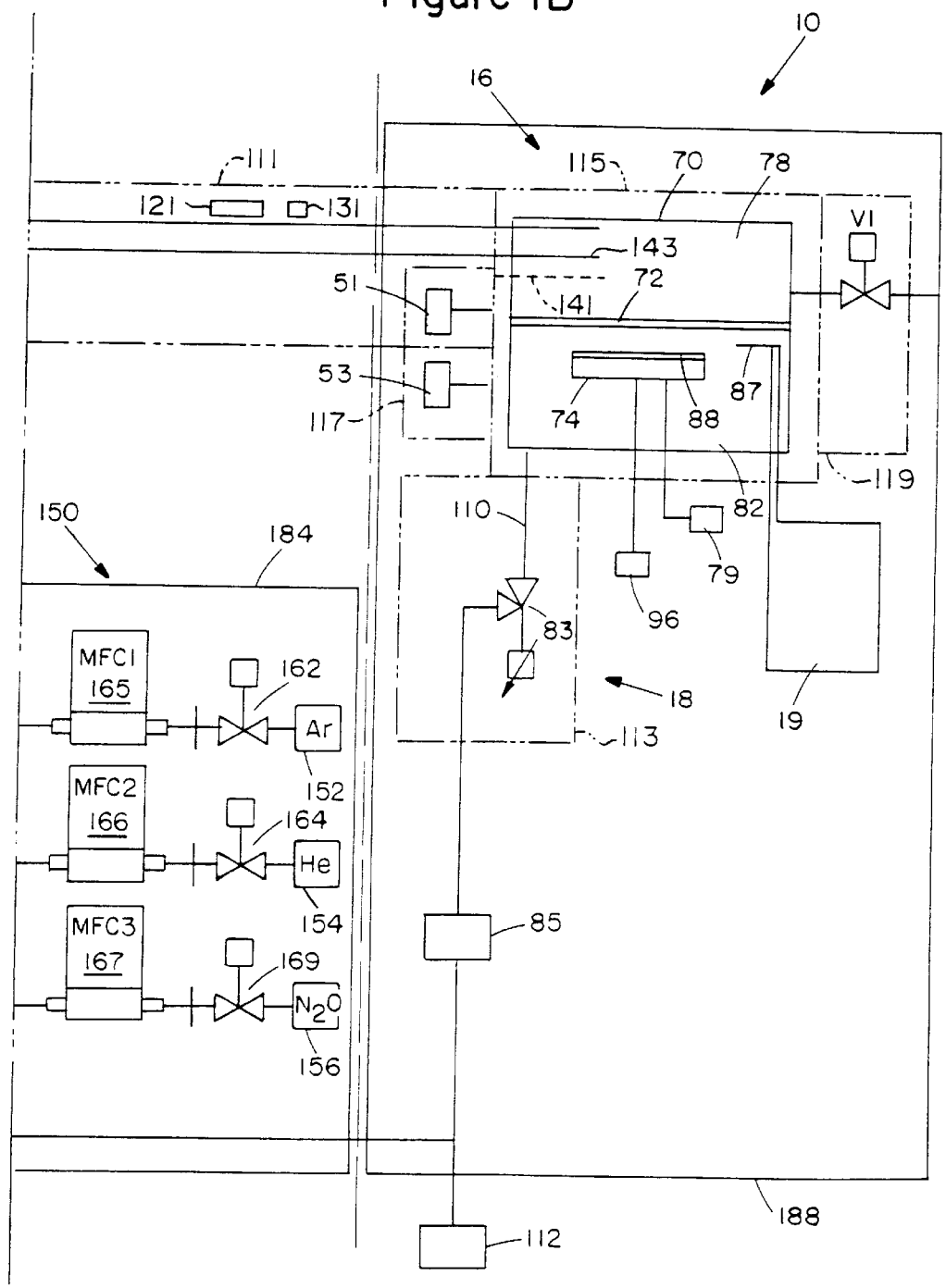

As illustrated in FIGS. 1A and 1B, a preferred embodiment of a CVD apparatus 10 of this invention includes four integrated subsystems, including a vaporization subsystem 12, a gas-flow-control subsystem 14, a process subsystem 16, and an exhaust subsystem 18. A distributed processing system, described below, provides integrated control and management of each of these subsystems. The distributed processing system and each of the subsystems 12, 14, 16 and 18 are all within a single free-standing CVD module 10 (illustrated in FIGS. 6a–c). The dimensions of the CVD module generally will not exceed a 1 m by 2 m footprint and preferably are no greater than about 1.2 m in length by about 0.6 m in width by about 1.8 m in height to achieve conformity with existing standards for integration with a wafer handler such that the free-standing CVD module can fit within the typically allotted footprint in a larger cluster tool configuration. In a further preferred embodiment, the CVD module fits within a standard footprint, as established by MESC, the standard design architecture adopted by Semiconductor Equipment and Materials International (SEMI), a trade organization of semiconductor industry suppliers, for connection to a wafer handler or transport module.

Each of boxes 103, 105, 107, 109, 111, 113, 115, 117 and 119 represents a separate control zone. Each of the control zones is independently heated with a separate cartridge heater 121. Further, the temperature in each control zone and at other heated elements of the apparatus is monitored by a resistance temperature detector or resistance thermometry detector (RTD) 131, of which one embodiment is a platinum resistance thermometer. The RTD is preferably encapsulated by a silicon nitride coating because of the heat conduction and low thermal mass of the silicon nitride. Alternatively, thermocouples or other temperature sensing devices can be used in place of the RTD's.

Figure 2A:
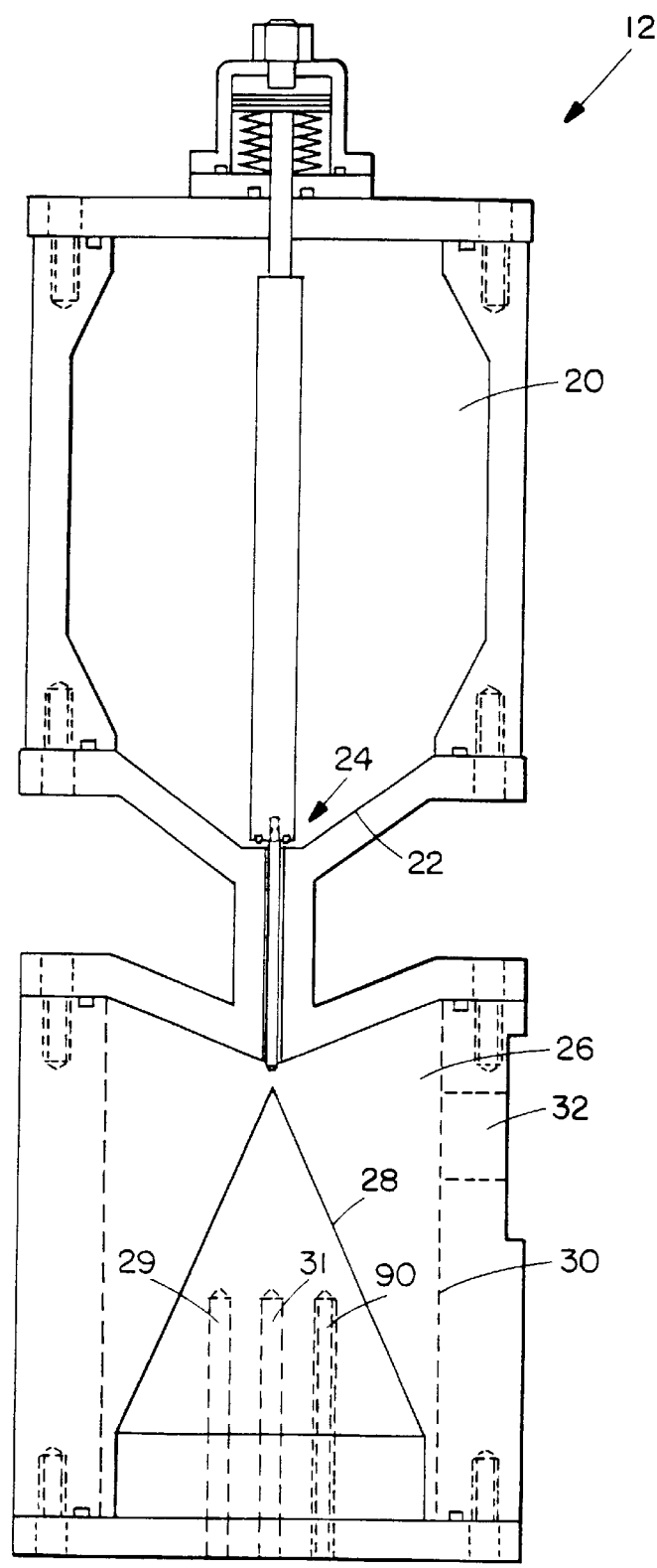
FIG. 2a is a cross-sectional illustration of a vaporization subsystem of this invention.

The vaporization subsystem 12, illustrated in FIG. 2a, is designed to generate a controlled supply of precursor vapor for deposition. The precursor, initially in liquid or solid form, is stored in a reservoir 20 fabricated from Inconel® or Inconel® alloys, such as Incoloy® 850 (available from Inco Alloys International, Inc., Huntington, W. Va.). Alternatively, the reservoir 20 is formed of 316L stainless steel. A funnel 22 is provided at the base of the reservoir 20, with a dispenser in the form of a dispensing valve 24 at the focal point of the funnel 22 for dispensing precursor from the reservoir 20. Where a liquid precursor is used, the dispensing valve 24 is an axial displacement pulse valve. Where a solid precursor is used, the dispensing valve 24 is a rotary valve. The reservoir 20 is thermally insulated from the vaporization chamber 26, discussed below, and is maintained at a temperature below that at which the precursor will be subjected to significant decomposition. Optionally, multiple reservoirs 20 are provided, each filled with a different precursor and each feeding into the vaporization chamber 26. As each precursor is needed, the appropriate reservoir 20 can be utilized. Alternatively, multiple reservoirs 20 each feed into their own vaporization chamber.

Figure 2B:
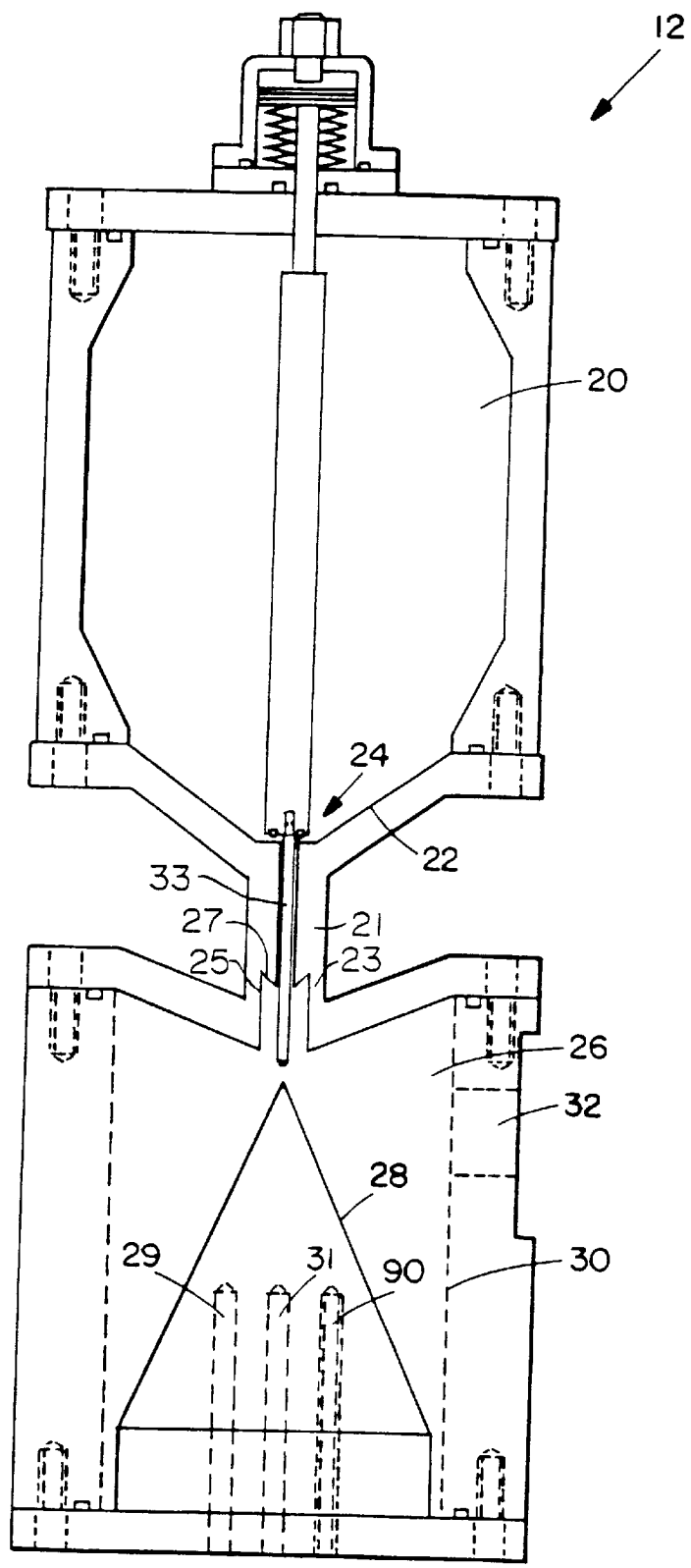
FIG. 2b is a cross-sectional illustration of another embodiment of a vaporization subsystem of this invention.
Figure 2C:
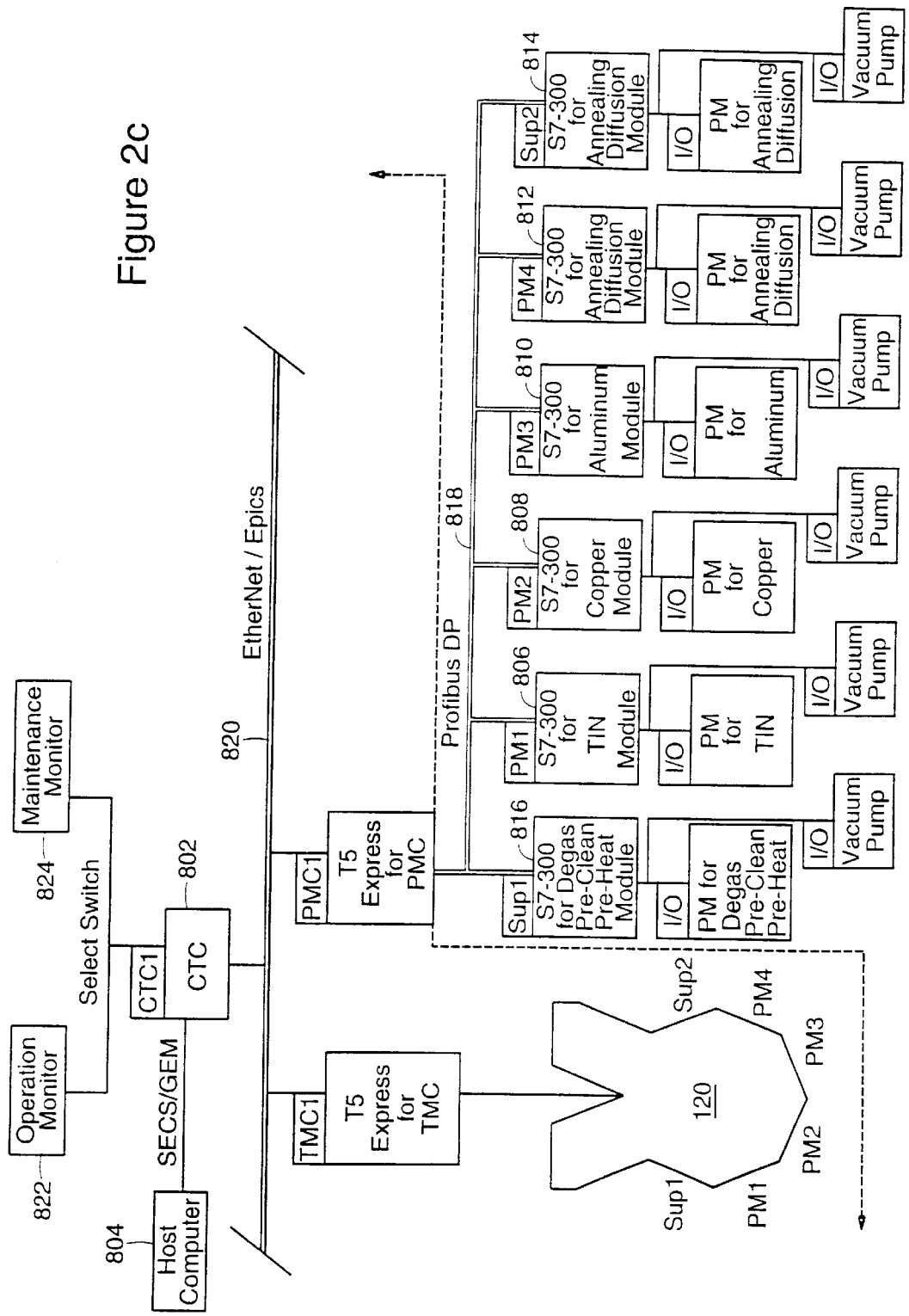
FIG. 2c is a schematic illustration of a control system of this invention.

A system for governing the supply of various precursors to a cluster tool 120 having one or more vaporization chambers 26 is illustrated in FIG. 2c. A cluster tool controller 802 is controlled by a programmable host computer or data processor 804 to regulate the delivery of precursors 806, 808, 810 for the deposition of titanium nitride, copper, and aluminum, respectively, for example. The cluster tool controller 802 is further programmed by the host computer 804 to regulate a pair of modules for annealing/diffusion 812, 814 and a separate module for pre-heating and pre-cleaning 816. Communication between each of these modules 806, 808, 810, 812, 814 and 816 and the cluster tool controller 802 is facilitated by a bus architecture that can include, for example, a ProfiBus data bus 818 in combination with an EtherNet/Epics data bus 820. Connected to the EtherNet/Epics data bus 820 is the cluster tool 120, allowing the cluster tool controller 802 to likewise govern operation of the cluster tool 120 to which the precursors from modules 806, 808, 810 are delivered. The system further includes a console for monitoring operation of the system 822 and a console for system maintenance 824. Both consoles 822 and 824 are connected to the cluster tool controller 802.

In operation, the cluster tool controller 802, as controlled by the host computer 804, can, in relatively rapid sequence, select various precursors from module 808, 810 and 812 for delivery to one or more vaporization chambers 26 (FIG. 2a).

This capability allows for a sequencing of starting materials in a single system, thereby allowing for a rapid sequence of depositions of different layers on a substrate in process modules of the cluster tool 120. Additional details regarding the various components of FIG. 2c, alternative embodiments thereof, and methods of using the same are described in greater detail below.

A vaporizer 28 that has ever-increasing surface area at distances away from the dispensing valve 24 is used to vaporize the precursor. The vaporizer 28 functions as a falling film molecular still, in which a liquid precursor generates a wavefront flowing down the surface of the vaporizer 28. The temperature of the vaporizer 28 is set to vaporize the precursor over the course of its travel across the vaporizer 28 surface. Contaminants with higher vaporizing temperatures will generally flow down the surface of the vaporizer 28 and fall off without vaporizing.

Preferably, the vaporizer 28 is in the form of an inverted cone and is positioned to receive precursor flowing from the dispensing valve 24. The vaporizer 28 is made from a thermally-conductive material coated or plated, as required, for the best chemical compatability with the precursor. In a preferred embodiment, the vaporizer 28 includes an electroless-nickel-plated OFHC substrate coated with a sulphamate nickel overplate, which in turn is optionally coated with rhodium overplating for very high corrosion resistance and inertness. The vaporizer 28 illustrated in FIGS. 1A and 1B is designed for vaporizing a liquid precursor. Alternatively, a multi-stepped-shape cone is used for solid precursors, wherein ridges are provided on the cone to collect the solid as it is delivered from the reservoir 20. One suitable embodiment of the vaporizer 28 includes a cone with a height of 4.20 inches and a base diameter of 3.70 inches. The vaporizer 28 and the reservoir 20 are removable so that they can be cleaned and replaced during scheduled maintenance. When in use, the vaporizer 28 is heated to a temperature sufficient to vaporize the precursor without causing it to suffer thermal decomposition.

The vaporizer 28 includes a plurality of bores 29. Heaters, e.g., Watt-Flex® cartridge heaters 90 (available from Dalton Electric Heating Co., Inc., Ipswich, Mass.) are inserted into four of these bores 29. In one example, the heaters are 3.0 inches in length and 0.25 inches in diameter. The heaters supply 50 watts at 24–25 VAC, and can be heated above 1000° C. Typically, though, the heaters are operated in the vicinity of 200° C. A platinum resistance thermometer is inserted into a central bore 31.

The vaporizer 28 is not intended to be used as a "flash vaporizer." Rather, it is intended that the precursor will spread across the vaporizer 28 surface, from which vapors will evolve. The vaporizer 28 offers the advantage of not being sensitive to small particles suspended in standard grades of liquid CVD precursor used in the semiconductor industry. In this embodiment, suspended particulates are left behind on the vaporizer 28.

A vaporization chamber 26 surrounds the vaporizer 28 and is made of OFHC copper plated with electroless nickel and sulfamate nickel and also rhodium if highly reactive or unstable precursors are used. The vaporization chamber 26 includes a principal cylinder 30 and a vapor outlet 32. The vaporization chamber 26 essentially serves as an expansion volume and reservoir for gases produced by the vaporizer 28.

A pressure sensor 34 is preferably positioned in the vapor outlet 32 for measuring the vapor pressure in the vaporization chamber 26. Alternatively, the pressure sensor 34 can be positioned in the principal cylinder 30. The pressure sensor 34 is heated to about the same temperature as the vaporizer 28 during operation to prevent condensation of the vaporized precursor. The pressure sensor 34 is coupled in a processor-driven control loop with the dispenser 24 to achieve a fairly constant pressure in the vaporization chamber 26. As pressure drops in the vaporization chamber 26, the dispenser 24 is signaled to dispense more precursor. Accordingly, the pressure sensor 34 and dispenser 24 work in concert to maintain the pressure in the vaporization chamber in a range between the pressure in the process chamber 70, discussed below, and the standard vapor pressure of the precursor at the temperature of the vaporizer. In this system, the response time for reestablishing the desired vapor pressure is typically about 10 seconds. Preferably, the pressure sensor 34 is a capacitance manometer with a 1000 torr full-scale range, or other, similar direct-measuring gauge.

FIG. 2b illustrates an alternative embodiment of the vaporization subsystem in which the base 21 of the neck 23 includes a groove, where the base is hollowed out to prevent thermal degradation of the precursor as it flows down rod 33 on the way to the vaporization chamber 26. Heat from the vaporizer 28 travels through the walls of the vaporization chamber 26 and into the neck 23. By hollowing out the neck 23, the inner wall 25 is spatially removed from the flow of precursor down the rod 33. The hollowed out section extends approximately midway up the neck 21. It ends at angled surface 27, above which the inner diameter of the neck is constricted. Vapor flowing up into the hollowed out section is prone to condense on angled surface 27, which directs condensed vapors back toward rod 33.

The vapor pressure throughout the system is maintained at relatively low levels. One reason why the system can be operated at low pressure levels is the close physical proximity of all of the subsystems. Accordingly, the vapors need travel only very short distances from vaporization to deposition. Because the vapor pressure and the velocity of the gas are low, the transport of particles throughout the system is significantly reduced in comparison to higher pressure systems, such as those which use a carrier gas.

Figure 3A:
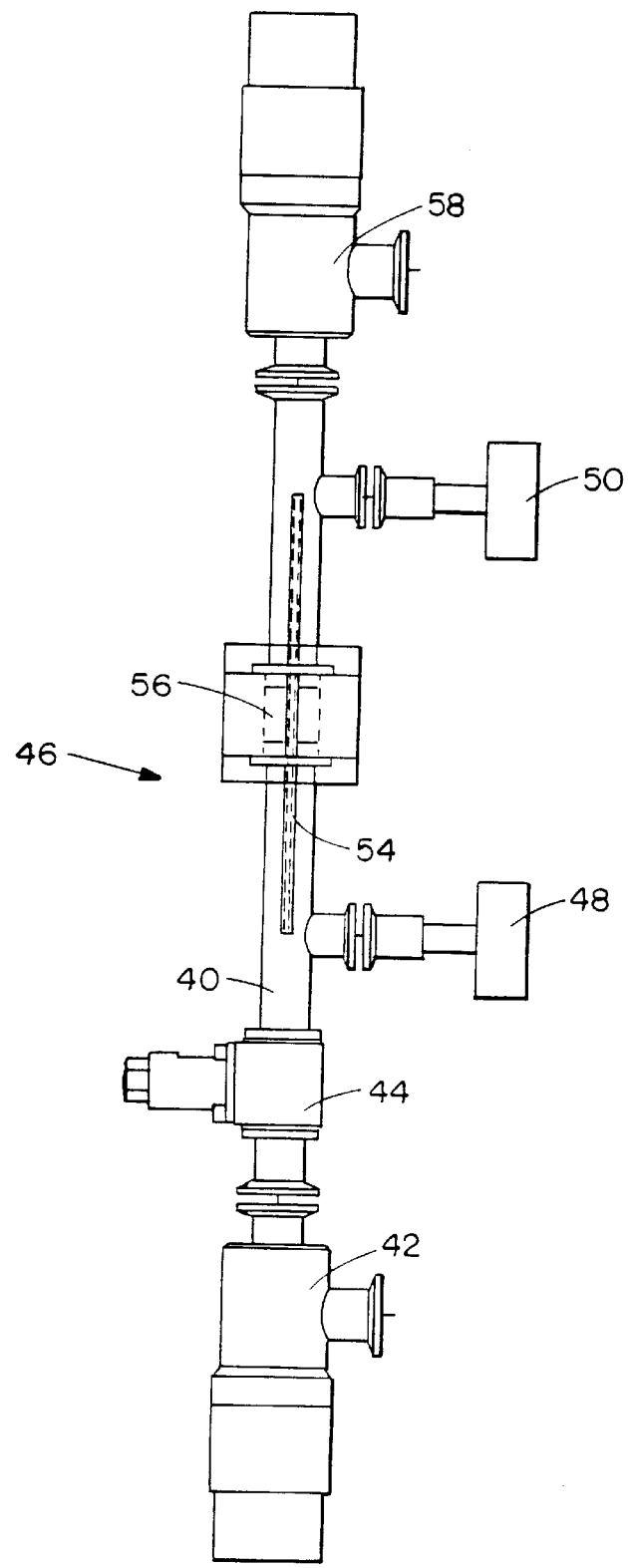
FIG. 3a is an illustration of a gas-flow-control subsystem of this invention.

The gas-flow-control subsystem 14 is illustrated in FIG. 3a. All items in the gas-flow-control subsystem 14 are enclosed in a heated conductive sheath, preferably of aluminum, which heats the items to approximately the same temperature as the vaporizer 28. The conductive sheath has a 3-inch by 3-inch square cross-section with a bore of just over 1-inch diameter in the center to accommodate the delivery conduit 40. Further, the conductive sheath includes casts of pressures sensors 48, 50 and other instruments, allowing the conductive sheath to conform to the exterior shape of the gas-flow subsystem. The conductive sheath includes bores into which heaters, e.g., Watt-Flex cartridge heaters and temperature sensors, are inserted. A delivery conduit 40 joins the vaporization chamber 26 and the process chamber 70. Preferably neither the length of the delivery conduit 40 nor the distance between the vaporization chamber 26 and the process chamber 70 exceeds 25 cm. A series of valves controls the flow of vapor between chambers 26, 70. An isolation valve 42 seals the vaporization chamber 26 from the delivery conduit 40. In one embodiment the isolation valve 42 is an HPS Lopro® valve modified to operate at high temperatures. In elements, such as the isolation valve 42, which must withstand high temperatures, all elastomer seals are a special high temperature material, such as DuPont Kalrez® 8101, Sahara® or Dry. A proportional control valve 44 (for example, those made by MKS Instruments, Andover, Mass.) designed to withstand high temperatures, provide high conductance and provide chemical compatibility with wet precursors is illustrated in FIG. 2a. Alternatively, a plurality of valves 44' connected in parallel, as illustrated in FIG. 1A, can be used in place of a single proportional control valve 44. The proportional control valve 44 is positioned downstream from the isolation valve 42 and is upstream from a flow meter 46 consisting of a pair of pressure sensors 48, 50 and a laminar-flow element 54. In the illustrated embodiment, the laminar-flow element is an open-ended tube 54 inserted through an orifice in an otherwise solid block 56 blocking flow through the delivery conduit 40. In one embodiment, the tube 54 has a length of 8.0 inches, an outer diameter of 0.375 inches, and an inner diameter of 0.280 inches. The tube 54 is oriented concentrically with and within the delivery conduit 40. In one embodiment of the method of this invention, the pressure drop across the tube 54, as vapor flows through the delivery conduit 40, is on the order of 0.1 torr.

The delivery conduit 40 has an internal diameter (I.D.) that is larger than that of pipes conventionally used for vapor precursor delivery in existing CVD systems. Preferably the internal diameter of delivery conduit 40 is between 12 and 40 mm. More preferably, the internal diameter is about 25 mm. The use of such a wider-I.D. conduit for vapor transport between the vaporization chamber 26 and the process chamber 70 (see FIGS. 4a–d) permits higher conductance for the vapor flow therein and, consequently, allows for adequate vapor flow at lower pressures. The vaporized precursor is delivered to the process chamber 70 through conduit 40 at no more than 50% dilution. In preferred embodiments, the vaporized precursor is delivered to the process chamber in a substantially undiluted state (i.e., less than 10% dilution). In further preferred embodiments, the vaporized precursor is delivered in an intrinsically pure form. Additional conduits 141 can also be provided to deliver vaporized precursors from other vaporizers to the process chamber 70.

Each of a pair of pressure sensors 48, 50, preferably capacitance manometers, is respectively aligned with an open end 57/59 of the tube 54. Accordingly, the difference in pressure measurements from the two pressure sensors 48, 50 will reflect the pressure drop across the tube 54, thereby allowing the rate of gas flow through the tube 54 to be calculated. A capacitance manometer is an electronic gauge providing a direct measurement of pressure in the delivery conduit 40. Where capacitance manometers are used, each manometer preferably has the same full-scale range, typically 10 torr. Suitable capacitance manometers include a specially-constructed Baratron® 121-based absolute pressure transducer (available by special order from MKS Instruments) and the model 622 Barocel® bakeable vacuum/pressure transducer (available from Edwards High Vacuum International, Wilmington, Mass.). The Baratron transducer is specially built and calibrated to operate at 200° C., in comparison to a standard Baratron® transducer, which is typically limited to 150° C.

The transducers are modified to remove all unnecessary mass and to promote uniform temperature distribution across the transducer. Accordingly, as a first step, the cover or shell of the transducer is removed. To do so, the cables attached to the Baratron® transducer are removed, the shell of the transducer is removed and discarded, and the cables are shortened and reattached. The housing support ring is also removed and discarded. Further, the port of the transducer is removed. Its length is machine cut, and it is then reattached. The electronics of the transducer are then re-calibrated to match the changed capacitance of the modified transducer. While the Barocel® transducer is available, off the shelf, for use at 200° C., as with the Baratron® transducer, the case of the Barocel transducer is removed, and its cables are removed and replaced.

Figure 3B:
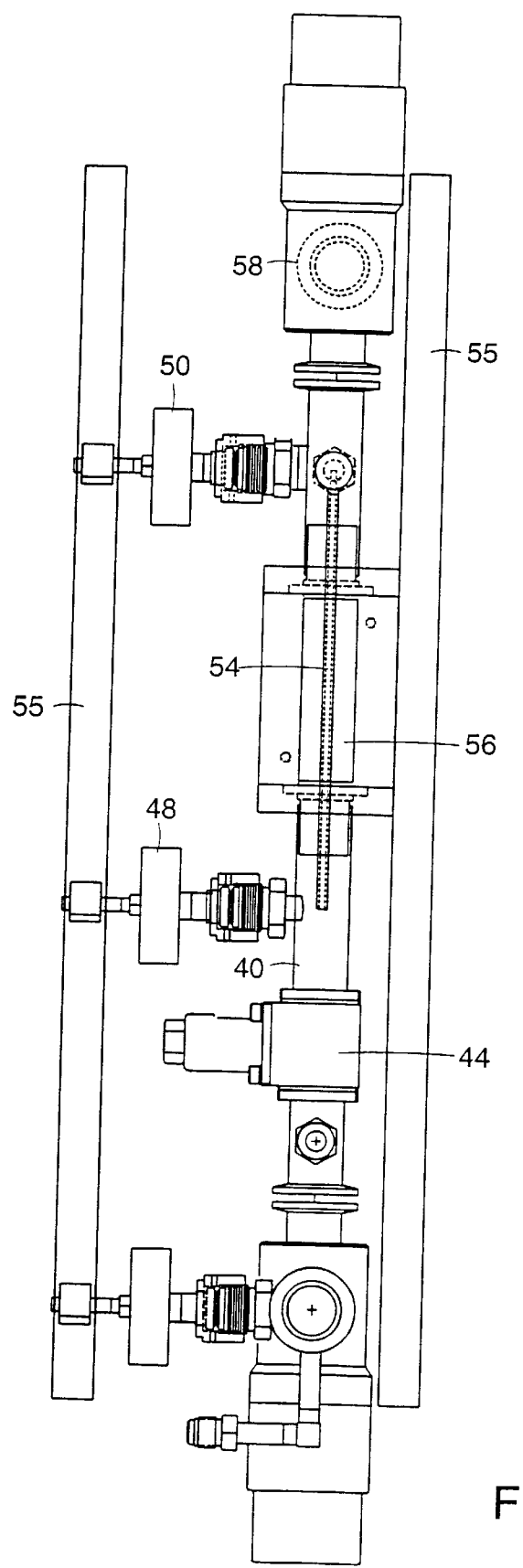
FIG. 3b is an illustration of another embodiment of a gas-flow-control subsystem of this invention.

In an alternative embodiment, illustrated in FIG. 3b, the solid block 56 surrounding the laminar flow element 54 extends further toward the ends of the laminar flow element 54. By lengthening the block 56, the volume of open volume surrounding the laminar flow element 54 is reduced. This open volume is generally considered to be "dead space." Reduction of this dead space is thought to provide a more direct and efficient flow path through the delivery conduit 40. In a further preferred embodiment, all or nearly all dead space is removed as the block 56 and the laminar flow element 54 essentially form a single tubular component such that vapor flowing through the conduit 40 will hit a wall at the capacitance manometer 48 and be directed through a bore, which acts as the laminar flow element 54, within that wall.

Also shown in FIG. 3b is a heated aluminum sheath 55, which is in thermal contact with the delivery conduit 40 and other components of the precursor delivery system.

The proportional control valve 44 is coupled with the flow meter 46 in a processor-driven control loop to regulate the flow of vapor through the delivery conduit 40. Accordingly, the flow meter 46 provides feedback regarding the pressure differential in the delivery conduit 40, and this feedback is used to direct the proportional control valve 44 to increase or decrease flow, which in turn, will respectively increase or decrease the pressure differential in the delivery conduit 40, as measured by the flow meter 46. This responsive regulation of the proportional control valve 44 is continued until the pressure differential, as measured by the flow meter 46, matches that which is needed to supply the precursor at the desired rate for reaction in the process chamber 70.

Alternatively, a single differential pressure transducer capacitance manometer, which measures a pressure drop across the laminar flow element, can be used along with a single absolute pressure transducer in place of the pair of capacitance manometers. Other alternative means for inducing a predictable pressure drop include a choked flow element or a molecular flow element in place of the laminar flow element.

The gas-flow-control subsystem 14 further includes a second isolation valve 58, e.g., an HPS Lopro® valve modified for high temperatures, positioned downstream from the flow meter 46.

In parallel with the vaporization and gas-flow-control subsystems 12, 14, a process gas subsystem 150 supplies additional reactant, purge and other process gases to the process chamber 70. The illustrated subsystem 150 includes sources of argon 152, helium 154, and nitrous oxide ($N_2O$) 156. Gas flow from each of these sources is regulated by a plurality of valves 162/164/169 and 161/163/168 with a mass flow controller 165/166/167.

Nitrous oxide from source 156 flows through valve 157 into process chamber 70 through exit port 143 for reaction with the vaporized precursor delivered through delivery conduit 40. After deposition is performed, argon from source 152 flows through valve 157 into process chamber 70 to purge the chamber 70. By opening valve 160 in conjunction with at least one of valves 155, 158 or 159, particular subsystems or segments of CVD apparatus 10 can be independently isolated and evacuated or backfilled. Additional reactant sources and plasma can be linked in parallel with the nitrous oxide for delivery to the process chamber 70.

Helium from source 154 is delivered through valve 157 into process chamber 70, where it is channeled through a conduit for release between a substrate chuck 74 and a substrate 88 upon which vapors are deposited to improve the transfer of heat between the substrate chuck 74 and the substrate 88.

The process subsystem 16 is designed to perform the actual deposition of reacted precursor vapor onto a substrate. The process subsystem 16, illustrated in FIG. 4a, includes a process chamber 70, a showerhead 72 and a substrate chuck 74.

The process chamber 70 typically is formed of electroless-nickel- and sulphamate-nickel-plated 6061 aluminum and is operated between 50° C. and 300° C. The process chamber 70 includes an access port 123, which can be joined to a wafer handler or cluster tool for transporting wafers into and out of the process chamber 70. A gate valve 125 is mounted to the access port 123 for controlling access there through. The process chamber 70 further includes an inlet port 76 in an upstream section 78 of the chamber 70 and an exhaust port 80 in a downstream section 82 of the chamber 70 through which vapor flow is managed. An outlet of the delivery conduit 40 projects into the chamber 70 through the inlet port 76, while the exhaust port 80 is connected to the exhaust subsystem 18. A pressure sensor 51 (e.g., a capacitance manometer) is positioned to measure the vapor pressure in the upstream section 78. At least one other pressure sensor 53 (e.g., a capacitance manometer) is positioned to measure the vapor pressure in the downstream section 82.

Figure 4A:
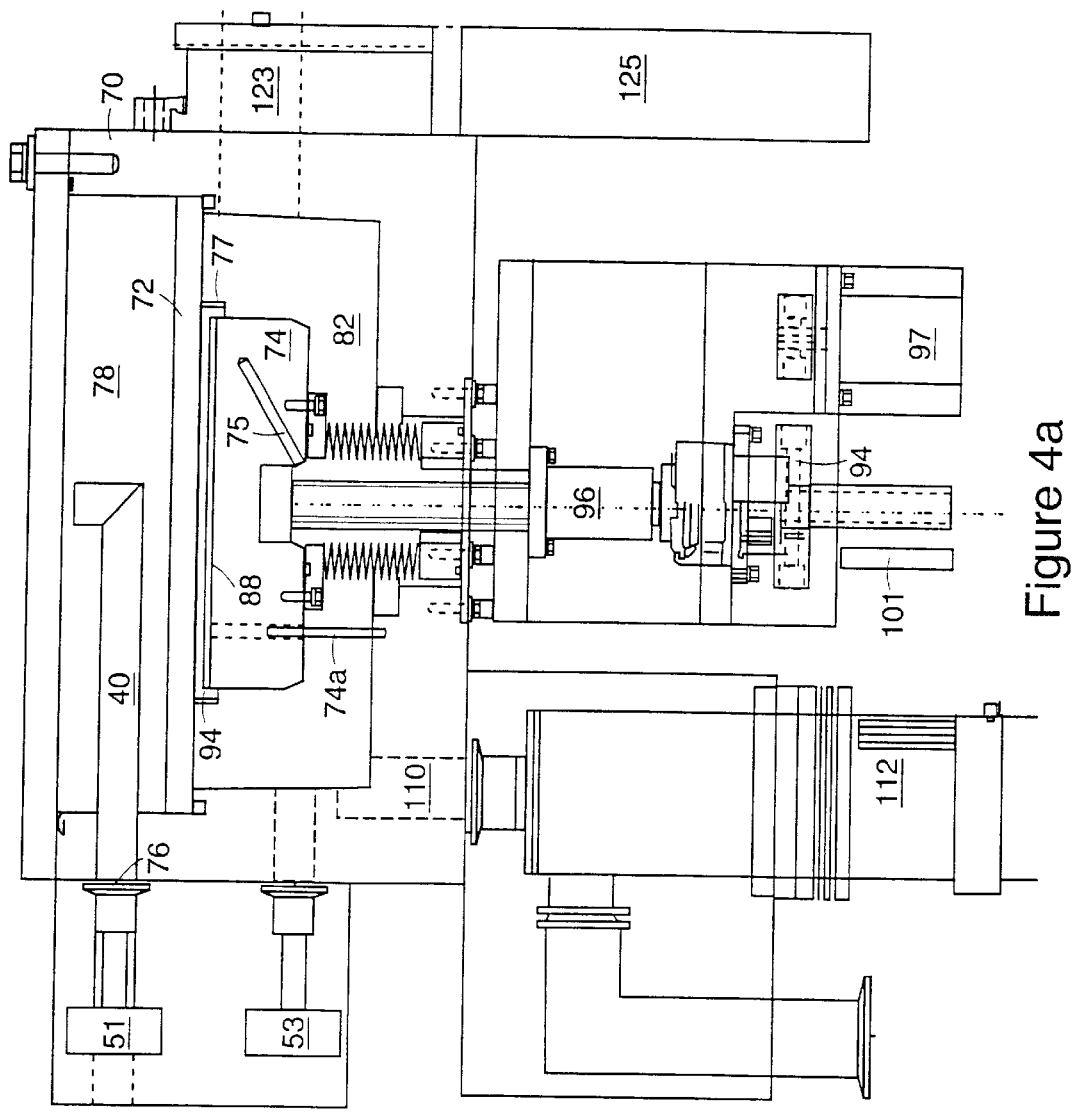
FIG. 4a is a view, partially in cross section, of a process subsystem of this invention.
Figure 5A:
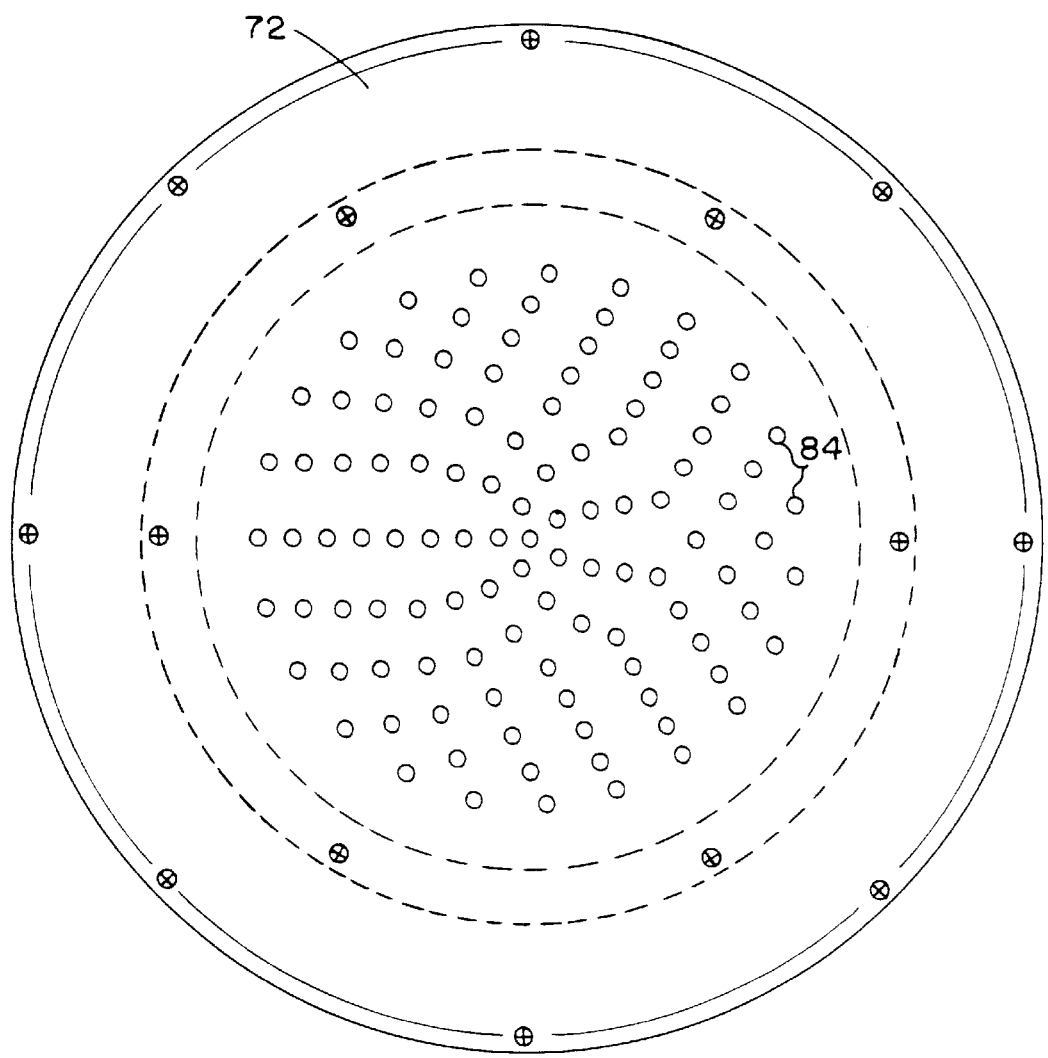
FIG. 5a is an illustration of a shower head of this invention.

A showerhead 72 segregates the process chamber 70 into upstream and downstream sections 78, 82. In one embodiment, the showerhead 72 comprises electroless-nickel- and sulphamate-nickel-plated 6061 aluminum and is in the form of a flat, circular plate with passages 84 for gas flow. The showerhead 72 is either passive, as illustrated in FIG. 4a, or active. An "active" showerhead is a showerhead which undergoes a change to alter the rate at which gas flows through it. In a preferred embodiment, the active showerhead includes an array of phase-change eutectic milliscale valves in place of the small holes 84 illustrated in FIG. 5a. These valves, which are available from TiNi Alloy Company (San Leandro, Calif.), are made of a thermal-phase-change material comprising a micromachined titanium and nickel alloy. The valves, which, in one embodiment, are about 0.1 inch in diameter, can be formed in situ on the showerhead plate en masse. The valves open when current is applied. The valves react in milliseconds, so they can be used in real time. They can also be used to effect dynamic patterns of valve actuation, e.g., sweeping action, pulsing, spots, etc.

Figure 5B:
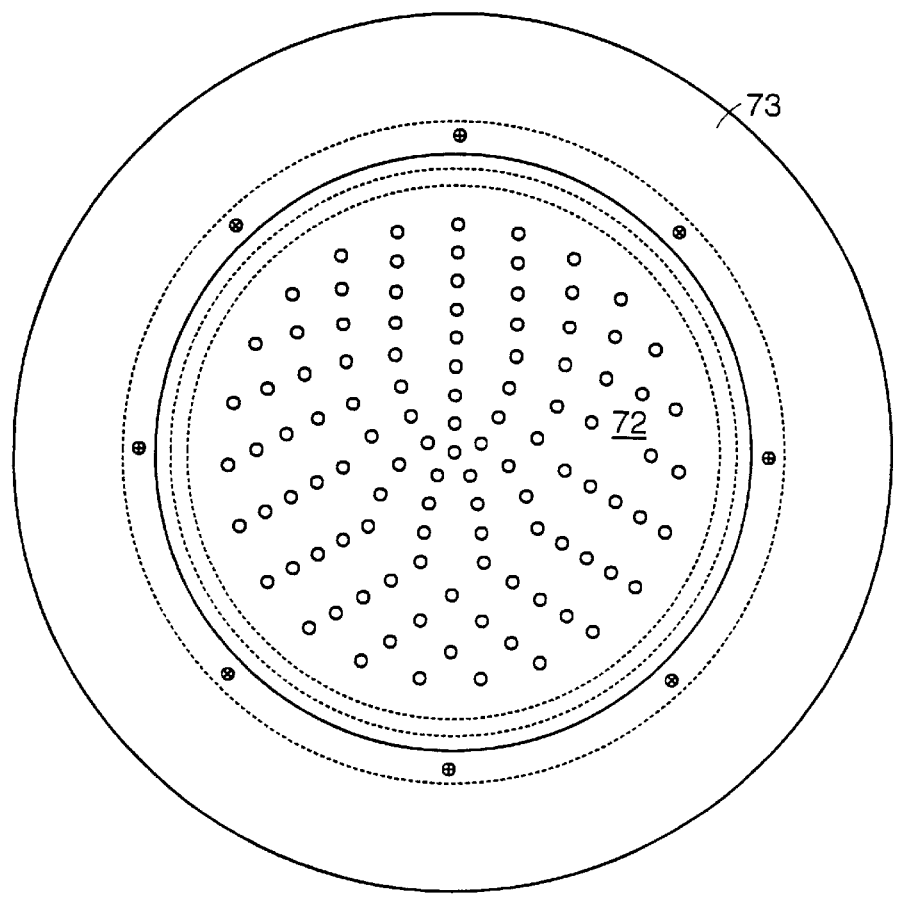
FIG. 5b is a top view of a replaceable showerhead mounted within a ring.
Figure 5C:
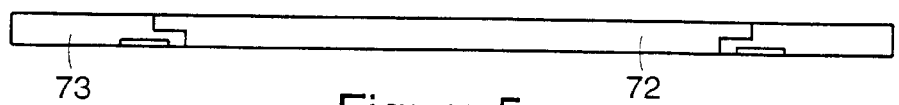
FIG. 5c is a cross-sectional side view of the showerhead and ring illustrated in FIG. 5b.

In an alternative embodiment, the showerhead 72 is a smaller plate with a diameter approximating that of the wafer 88. This embodiment is shown from a top view in FIG. 5b and, in cross-section, from a side view in FIG. 5c. As shown, the showerhead 72 is replaceably fitted into a larger ring 73 and is no larger than a confined process volume, described below. Accordingly, various showerheads may be exchanged in the larger ring for use with different sized wafers and with different process conditions. The use of smaller showerheads reduces cost, provides greater flexibility in processing, and concentrates the flow of process gases exclusively into the volume immediately above the substrate 88.

A substrate chuck 74, positioned in the downstream section 82, comprises electroless-nickel-plated OFHC copper, with an electroplated sulphamate nickel overplate, and, optionally, an overcoat of a flame-sprayed aluminum oxide or other, similar insulating ceramic. The substrate chuck 74 is designed to hold a substrate 88 upon which the precursor is to be reacted. The substrate chuck 74 includes a plurality of bores 75 radiating outward and into the substrate chuck 74. A platinum resistance thermometer is inserted through one of the bores 75 to measure the temperature of the substrate chuck 74 The substrate chuck 74 is heated by Watt-Flex® cartridge heaters (available from Dalton Electric Heating Co., Inc., Ipswich, Mass.) inserted into the remaining bores 75. In this embodiment, the heaters are 3.0 inches in length and 0.25 inches in diameter. The heaters supply 50 watts at 24–25 VAC, and can be heated above 1000° C. The heaters, however, are typically operated at a maximum of 650° C., and, more commonly, around 300–500° C. These temperatures are considerably lower than the temperatures to which a wafer is typically heated in conventional thermal CVD processes, i.e., 800–1300° C. The reason why, in the system of this invention, the substrate can be operated at lower temperatures is that the vaporized precursor is provided at higher concentrations at the wafer due to the absence of a carrier gas, the shorter delivery paths, and the higher conductance of the conduits.

As an alternative or supplement to the above-described heating means, the substrate can be heated by a laser, an ion beam, an electron beam and/or photon-assisted energy sources. In any case, the substrate is heated to a temperature higher than the temperature of the walls of the process chamber.

In one embodiment, a DC or AC bias is supplied to the substrate chuck 74 by a voltage source 79. The elevator shaft can also be biased in order to provide electrical bias across the substrate. The electromagnetic field generated by the bias can influence the crystalline structure of the thin film as it grows on the substrate. It has been shown that an otherwise uniform film (with a lattice orientation of <100> for example) can be induced to grow in a different crystalline structure (<111> for example). In some cases, a film is induced to grow in a gradient from one structure (e.g., <100>) to another (e.g., <111>) by applying either a DC or AC bias to the substrate 88 relative to the rest of the chamber. To achieve this bias, a ceramic ring is used to electrically isolate the substrate chuck 74 from the process chamber 70 and other components within the process chamber 70, which are held at ground. Alternatively, and more commonly, the lower portion of the process chamber 18 coated with aluminum oxide of sufficient thickness to isolate the chuck and bellows from the chamber.

A substrate 88, e.g., a silicon semiconductor wafer, is mounted on the substrate chuck 74 and is subject to the generated DC or AC bias. A mask (or clamp) 94 extends down from the showerhead 72 and forms a ring which masks the outer 0.5 to 3.5 mm or more but more typically 1.5 to 2.0 mm from the edge of the substrate 88. The mask 94 also shrouds the edge of the substrate 88 and prevents CVD from occurring on the edge or underside of the substrate 88. The mask 94 is formed of a material having very low thermal conductivity to minimize heat loss to any area, other than the substrate, that is exposed to unreacted process gas. Preferably, the mask is formed of either Incoloy® 850, Elgiloy® (available from Elgiloy Ltd. Partnership, Elgin, Ill.) or molybdenum and, optionally, includes a coating of either aluminum oxide ($Al_2O_3$), silicon dioxide ($SiO_2$) or other, similar dielectric material. Alternatively, the mask 94 is formed of ceramic.

When the substrate chuck 74 is lowered, the mask 94 is suspended above the substrate 88.

A flow shield 77 extends down from the showerhead 72 and forms a ring within which the substrate 88 is positioned. The flow shield 77 channels the flow of reactant gases through the showerhead 72 and across the exposed face of the substrate 88.

The substrate chuck 74 is raised and lowered by an elevator 96, upon which the substrate chuck 74 is mounted. The elevator 96 is electrically isolated. The elevator 96 is powered by a stepping motor 97, with the power being transmitted by a drive shaft 99. The position of the elevator 96 is continuously adjustable over a range from fully retracted to fully extended, providing a working stroke of about 70 mm. The changing position of the substrate chuck 74 is measured by a linear voltage differential transformer 101, which can measure the height of the elevator with sub-micron precision. By raising and lowering the substrate chuck 74, the flow character of vapor reactants above the substrate 88 can be altered. Accordingly, the substrate chuck 74, when raised and lowered by the elevator 96, can be used as a throttle valve controlling the flow rate through the showerhead 72. The vertical position of the chuck 74 can also be changed to modify the microstructure and properties of the deposited film.

Further, the showerhead 72, the mask 94, the replaceable gettering ring 89, the flow shield 77 and the substrate 88 are positioned to cooperatively define a confined process volume to which the vapor precursor and, if required, reactant gas are delivered and in which deposition will occur. The diameter of this volume (i.e., as defined by the mask 94) is preferably no more than about 120% the diameter of the substrate. The height (or depth) of the volume is a function of the position of the elevator, which governs the height of the substrate 88. This volume, where processing occurs, is much smaller than that of conventional CVD reactors and, consequently, improves the efficiency of deposition on the substrate.

In the method of this invention, deposition occurs when process gases contact the heated substrate 88 and react to form a solid thereon. Deposition at the surface of the substrate can be rate-limited either by the rate of precursor transport or by the rate of reaction at the surface. In a typical CVD and plasma-enhanced, plasma-assisted or plasma-promoted vapor deposition (PECVD, PACVD, PPCVD) process, the limiting factor is the rate of precursor transport. Consequently, the rate of surface reaction will be suboptimal and the vaporized or dissociated precursor will tend to react and deposit in a line-of-sight manner on the first hot surface that it contacts. Moreover, the use of a plasma, causes vapor-phase reactions which also mitigate against conformal coverage on the surface. As a consequence, and as shown in FIG. 5e, the deposited layer 192 formed at the mouth of an etched cavity 194 in a substrate will grow much more quickly than will a layer 192 forming on more remote areas of the cavity 194.

Figure 5F:
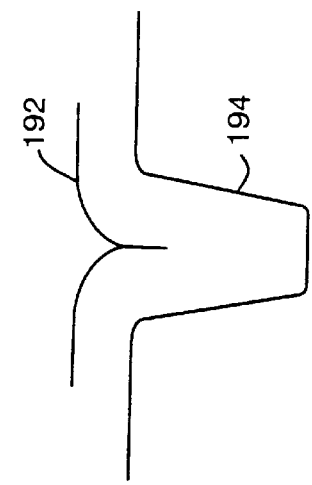
FIG. 5f is an illustration of a deposited layer that can be formed with the apparatus and method of this invention.
Figure 5E:
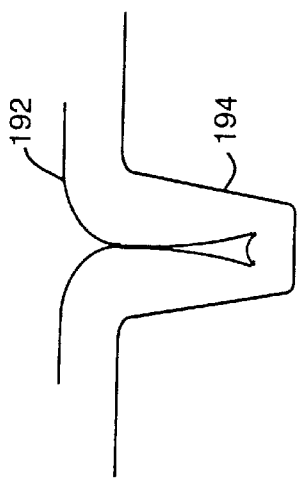
FIG. 5e is an illustration of a typical deposited layer formed in a cavity via conventional CVD processes.
Figure 5D:
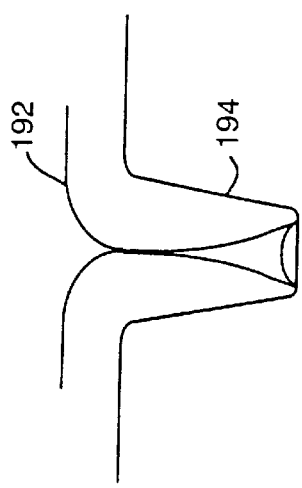
FIG. 5d is an illustration of a typical deposited layer formed in a cavity via PVD processes.

For further comparison, FIG. 5d illustrates a typical deposited layer 192 formed via physical vapor deposition (PVD). The deposited structure 192 has a similar pinched-off shape with very little deposit forming at the deeper regions of the cavity 194. This imbalance results from the directional, line-of-sight deposition that is characteristic of PVD.

In contrast, however, FIG. 5f illustrates the approximate structure of a conformal deposit 192 that can be formed in accordance with the equipment described herein and in accordance with the method of this invention. In this embodiment, the pinching effect at the mouth of the cavity 194 is noticeably diminished because the deposition process is limited by the reaction kinetics at the surface rather than by the rate of precursor transport, with the resulting tendency for deposition to occur simultaneously and uniformly on all exposed surfaces of the substrate.

A plurality of pins (preferably, at least three) engage the substrate chuck 74 through bores within the substrate chuck 74. The pins are cylindrical with rounded ends. One such pin 74a is illustrated in FIG. 4a. In this embodiment, the pins are mounted to the base of the downstream section 82 of the process chamber 70. On the other hand, when the elevator 96 is lowered, the substrate chuck 74 slides down the pins toward the base of the downstream section 82. When the substrate chuck 74 is fully retracted, the pins extend through the top surface of the substrate chuck 74 to lift the substrate 88 off the chuck 74. After it is lifted off the chuck 74, the substrate 88 can then be removed from the process chamber 70 by a robot arm. A similar process, illustrated in FIGS. 12a–d, is performed to place the wafer on the substrate.

Figure 4B:
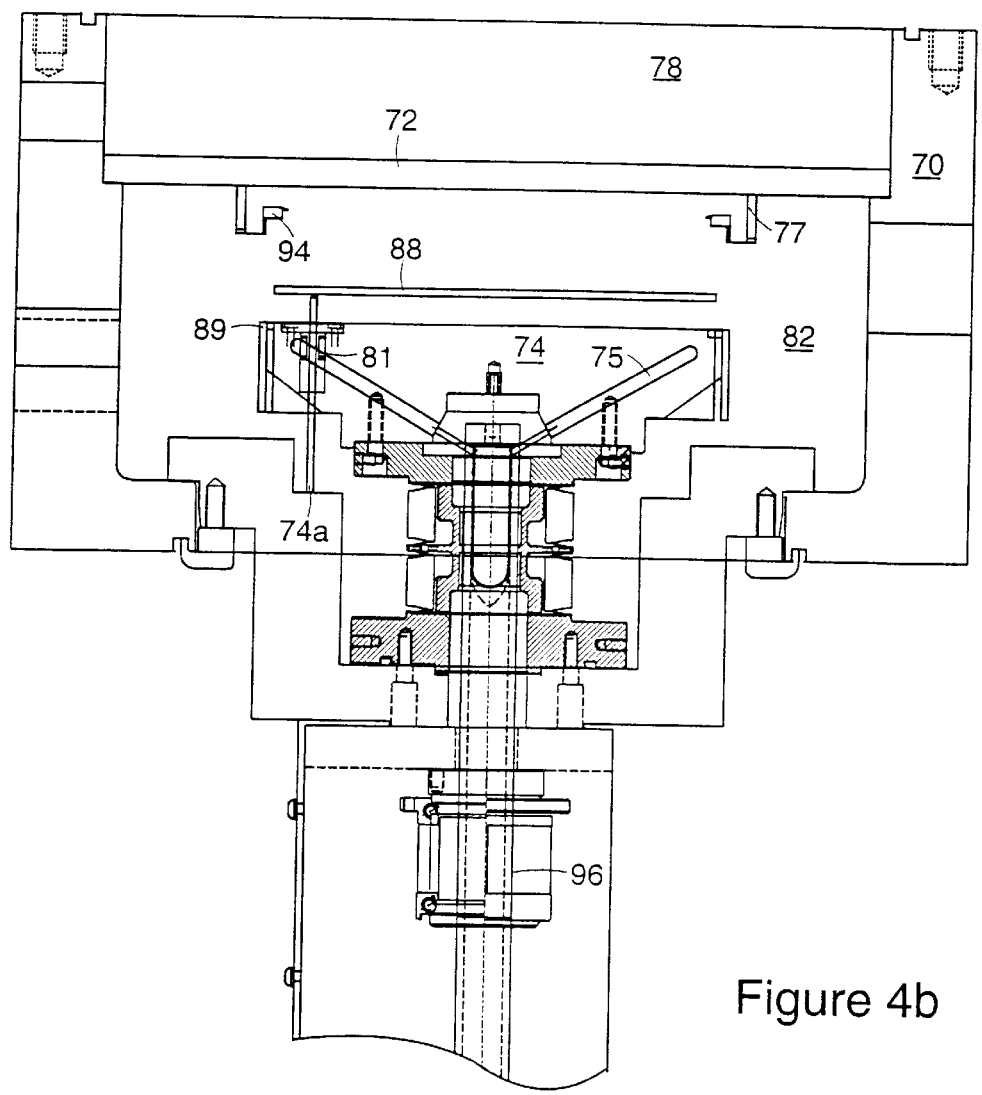
FIG. 4b is a cross-sectional view of another embodiment of a process subsystem of this invention, with the substrate chuck in a retracted position.

In an alternative embodiment, illustrated in FIG. 4b, each self-aligned pin 74a is attached to the substrate chuck 74 by bellows 81. The bellows 81 provides a spring-like support because the free height of the bellows 81 is greater than the depth of the cavity in which it is mounted. When the chuck 74 is fully retracted, as shown in FIG. 4b, the pin 74a is forced through the chuck 74, lifting the substrate 88 off the surface of the chuck 74. When the elevator 96 is used to raise the chuck 74 toward the showerhead 72, the pin 74a drops back down to a position where it remains held in place by the bellows 81 within the chuck 74 below its top surface.

FIG. 4b also illustrates a replaceable gettering ring 89 to mask the side of the chuck 74 from deposition. The side of the chuck 74, which is heated throughout, typically is subject to an accumulation of deposits from unreacted precursors which do not react on the substrate 88. After deposits build on the replaceable gettering ring 89, the ring 89 can be simply replaced without any damage to the chuck 74 and without requiring that the chuck 74 be replaced. Accordingly, use of the replaceable gettering ring 89 can greatly extend the useful life of the chuck 74.

The replaceable gettering ring 89 also serves as a support for the substrate 88 when the pins 74a are retracted. Accordingly the substrate 88 is not in physical contact with the substrate chuck 74. Rather, a gap of about 0.015 inches (0.38 mm) exists between the substrate 88 and the chuck 74. As noted, this gap is filled with helium gas which transfers heat between the chuck 74 and the substrate 88. The mask 94 seals the gap at the edge of the substrate 88, thereby containing the helium gas. The pressure of the helium gas between the substrate 88 and the chuck 74 is controlled, and the flow of helium is also monitored and/or controlled.

Figure 4D:
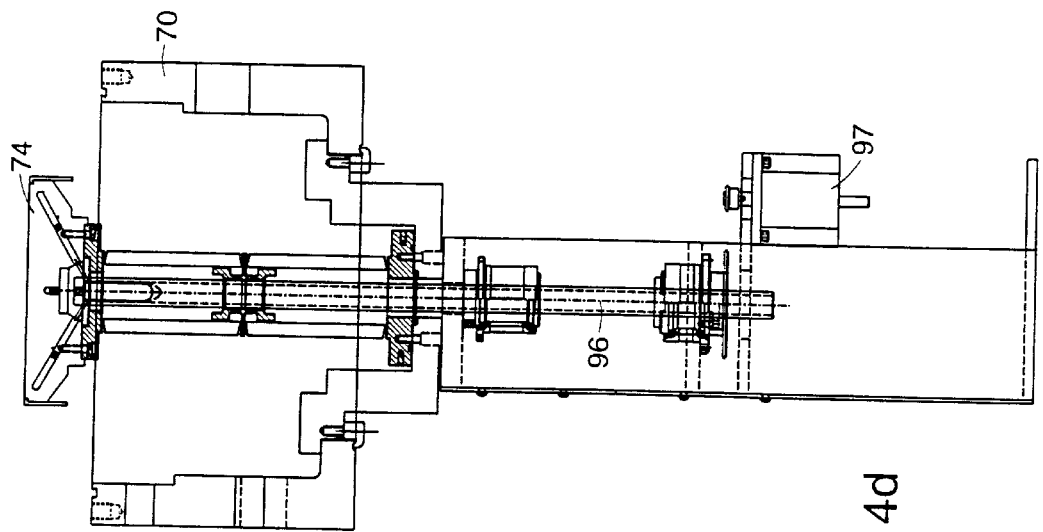
FIG. 4d is another cross-sectional view of the embodiment of FIG. 4b, with the substrate chuck in a fully-extended position.
Figure 4C:
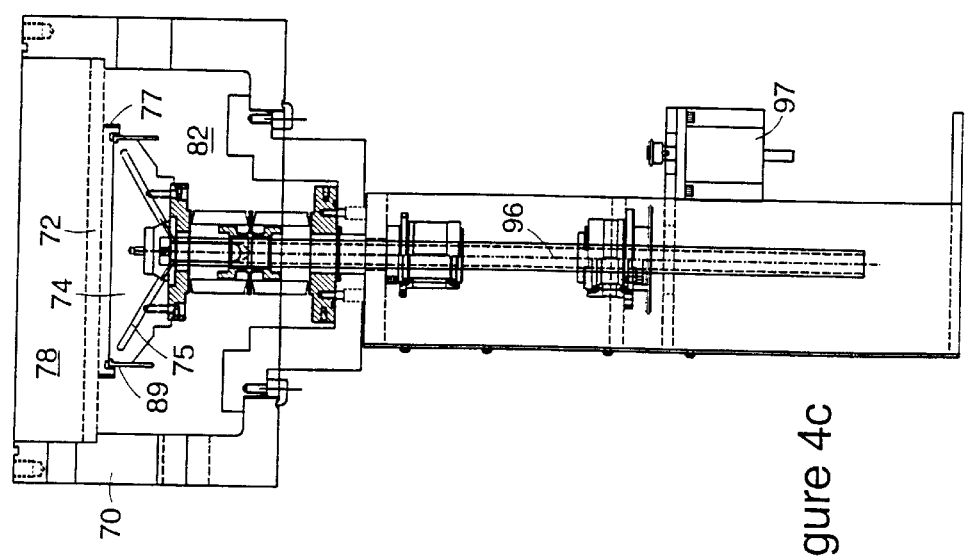
FIG. 4c is a cross-sectional view of the embodiment of FIG. 4b, with the substrate chuck raised to a processing position.

FIG. 4c illustrates the apparatus of FIG. 4b with the chuck in position for wafer processing. FIG. 4d also shows this same apparatus, this time with the shaft of the elevator fully extended. In this position, the chuck 74 is lifted out of the processing chamber 70, providing access to the chuck for service/maintenance.

Optionally, a sensor 87, e.g., an optical thickness sensor including a grazing incidence laser, is provided in the process chamber 70 for measuring the thickness or chemistry of the deposited film or the ambient conditions in the process chamber 70.

The final subsystem, i.e., the exhaust subsystem 18, is designed, in part, to maintain a pressure differential across the showerhead 72. The exhaust subsystem 18 includes an exhaust conduit 110 connected to the downstream section 82 of the process chamber 70, a trap vessel 85, and a vacuum pump 112 (IQDP 80, available from Edwards High Vacuum International, Wilmington, Mass., or equivalent) connected to the exhaust conduit 110 opposite the process chamber 70 to thereby pump vapors from the process chamber 70, through the exhaust conduit 110. Alternatively, more than one vacuum pump 112 can be used. A throttle valve 83 is positioned in the exhaust conduit 110 to regulate the amount of vapor pumped from the process chamber 70 and, accordingly, to maintain a desired vapor pressure in the process chamber 70. In this embodiment, the trap vessel 85 is situated between the vacuum pump 112 and the throttle valve 83. The purpose of the trap vessel 85 is to trap a majority of the unreacted precursor vapor before it reaches the vacuum pump(s) 112. The trap vessel 85 includes surfaces that cause the precursor to react or be otherwise retained thereupon due to chemical or thermal decomposition or an entrainment process.

Figures 1, 1C:
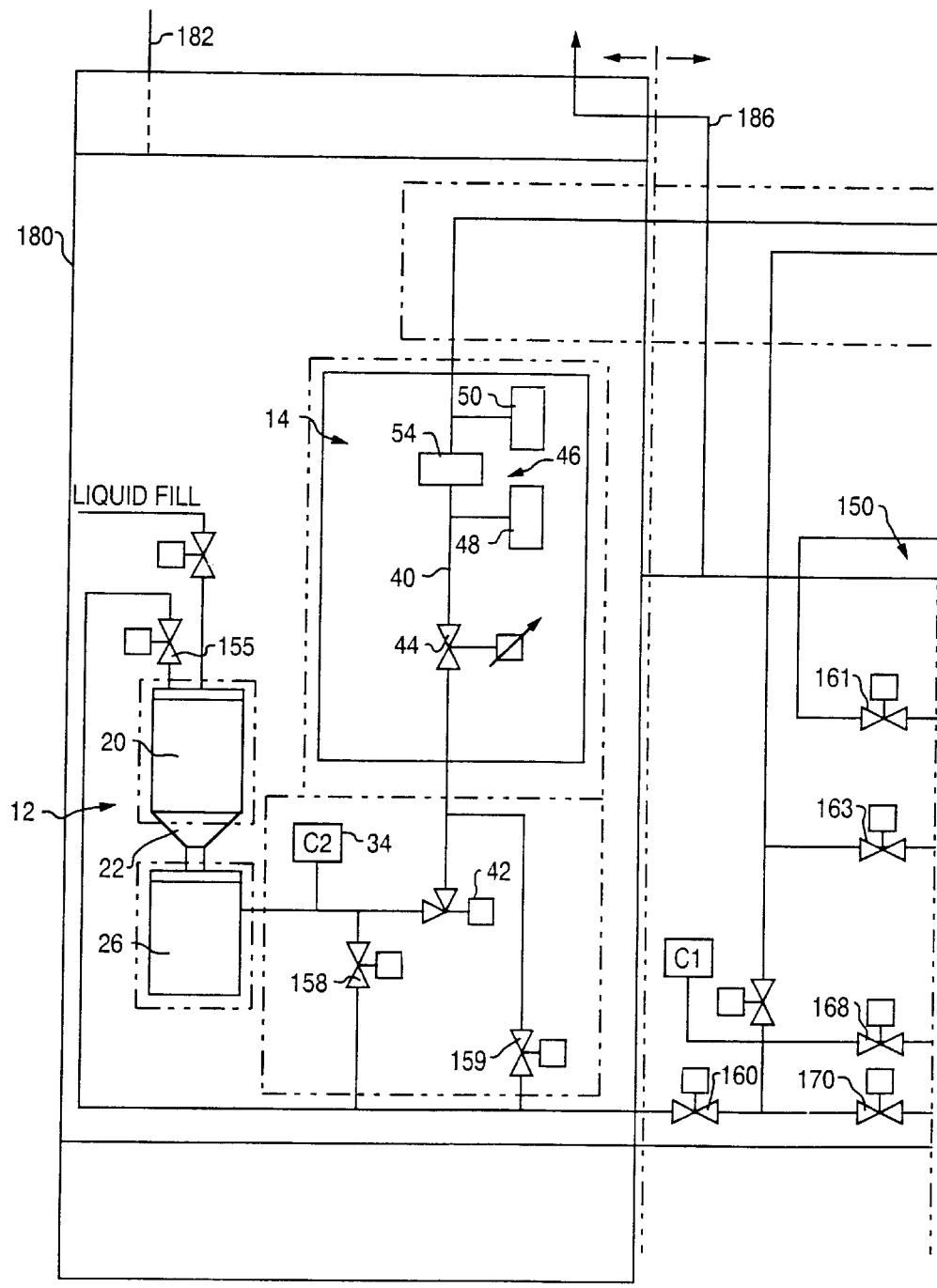
FIGS. 1C and 1D provide a schematic illustration of another embodiment of an apparatus of this invention.
Figure 1D:
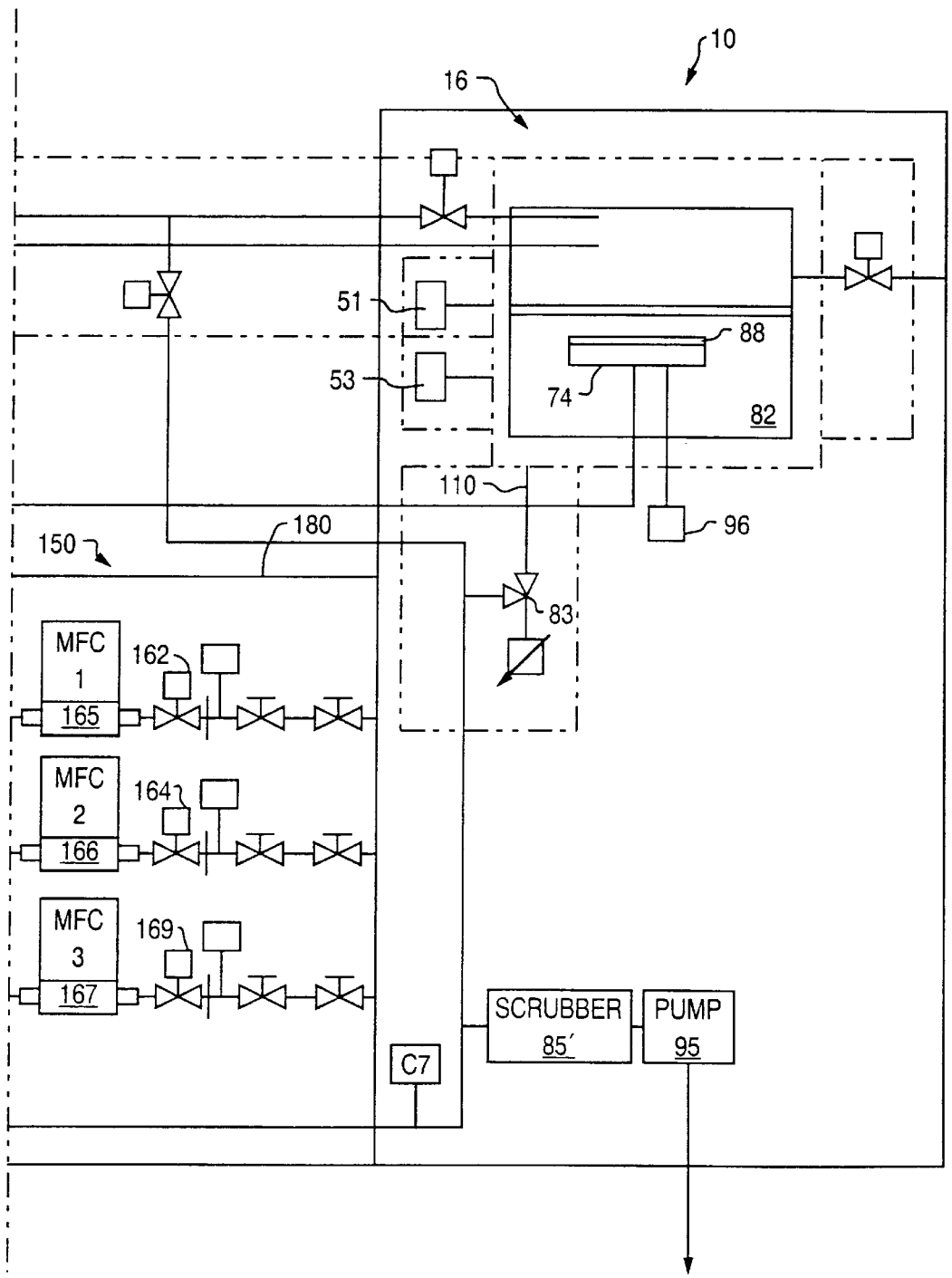

In an alternative, preferred embodiment, illustrated in FIGS. 1C–D, a scrubber 85' is used in place of the trap 85. The scrubber 85' actively removes harmful contaminants from the gas stream before exiting the process subsystem thereby providing a cleaner effluent leaving the system. A small, dry, low-power, dynamic, variable-speed pump 95 is also provided within the process subsystem cabinet 16. A preferred embodiment of pump 95 is manufactured by Pfeiffer Vacuum (Nashua, N.H., USA), which pumps at rates up to 50 m$^3$/hr. The pump 95 is integrated with the control system, through a ProfiBus data bus, such that the pumping speed of the pump 95 is controlled to govern the rate at which vapor is drawn through the system via a closed loop processing system. By so controlling the pumping speed, the throttle valve 83 upstream from the pump 95 can be omitted.

Each of the subsystems 12, 14, 15, 18, 150 are enclosed in sealed vessels to contain leaks of any hazardous gases from the system. The vaporization and gas-flow-control subsystems 12 and 14 are both contained in a first sealed vessel 180. An exhaust line 182 is connected to the first sealed vessel 180 for the controlled release and removal of gases escaping from the system. A second sealed vessel 184, which likewise includes an exhaust line 186, encloses the process gas subsystem 150.

Figure 6C:
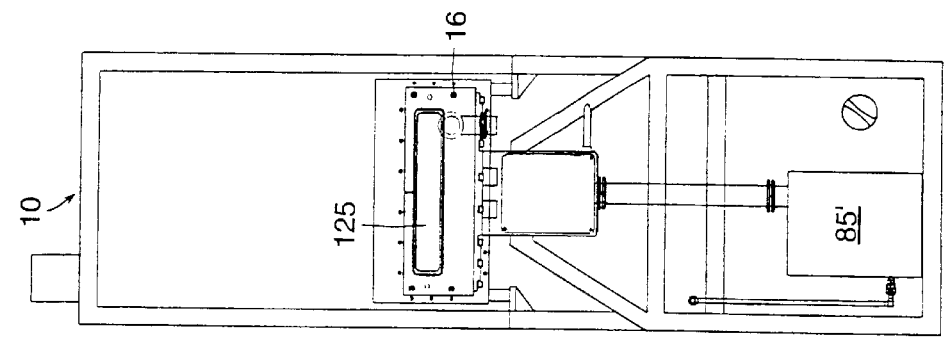
FIGS. 6a, 6b and 6c are perspective views of one embodiment of the CVD apparatus of this invention.
Figure 6B:
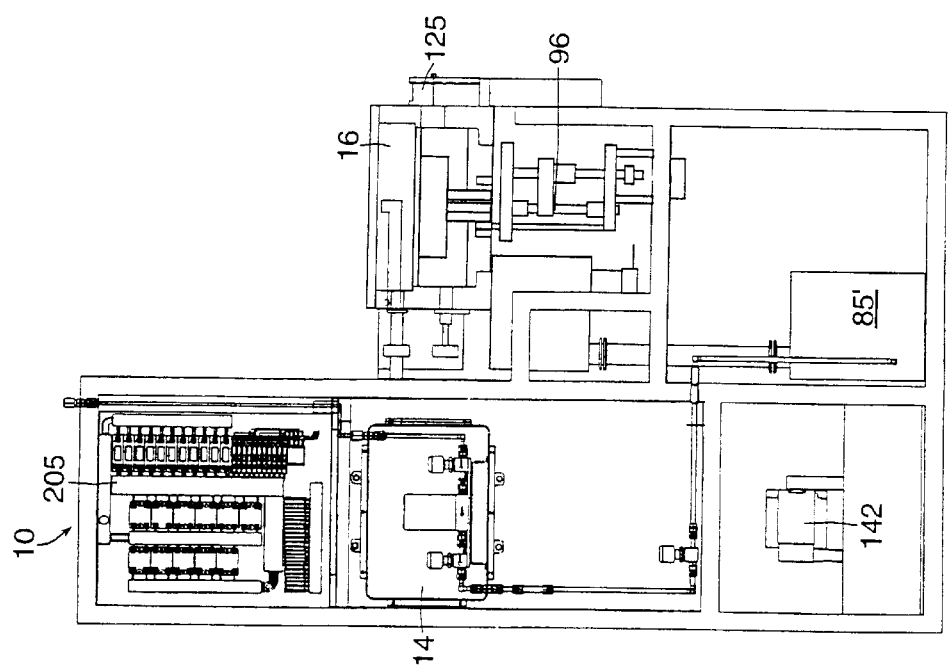
Figure 6A:
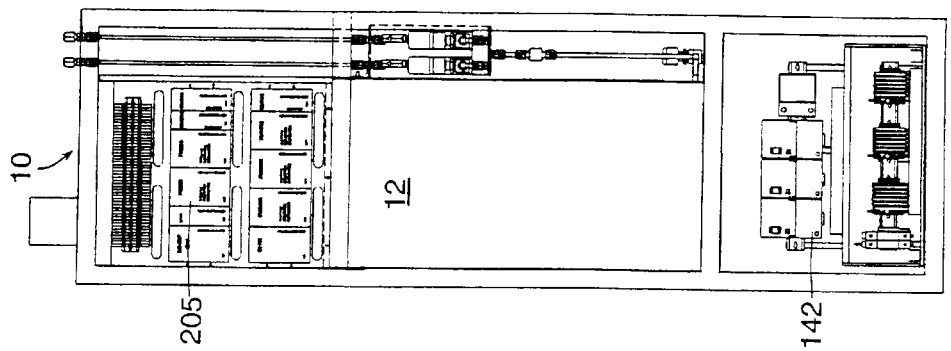

A CVD module 10 incorporating the various subsystems described herein is illustrated from three different perspectives in FIGS. 6a–c. FIG. 6a illustrates a rear view (from the vantage point of a connected wafer handler) of the CVD module 10. FIG. 6b illustrates a side view of that same CVD module. Finally, FIG. 6c illustrates a front view of the CVD module 10. Components that are all included within the module include a process module controller 205, a vaporization subsystem 12, a power input module 142, a gas-flow-control subsystem 14, a process subsystem 16, an elevator 96, a scrubber 85', and a gate valve 125.

Figure 7:
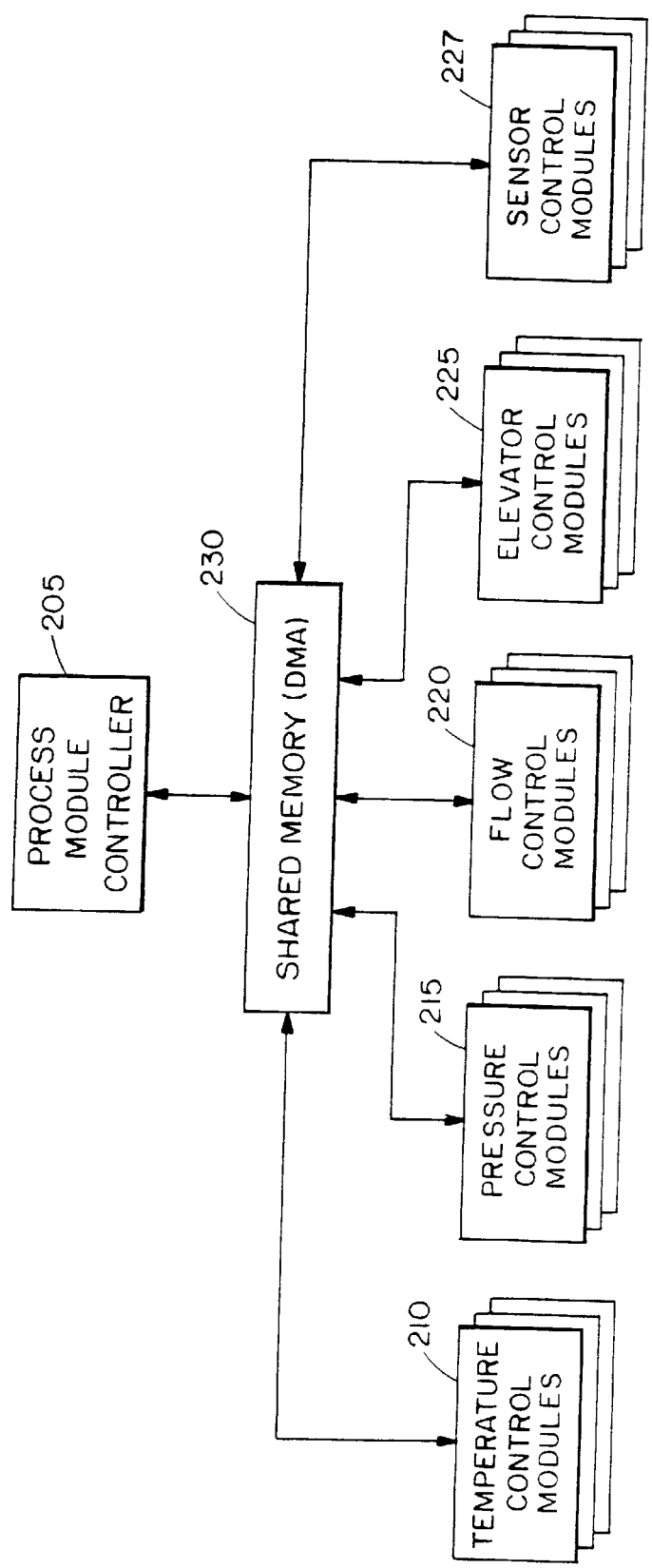
FIG. 7 illustrates the control architecture of a CVD apparatus according to one embodiment of the invention.

FIG. 7 illustrates a general control architecture diagram 200 for control of a single CVD apparatus 10 and its associated subsystems. Control of a CVD apparatus 10 is facilitated through a process module controller 205 operating under software control in a distributed manner to independently control temperature control modules 210, pressure control modules 215, flow control modules 220, and elevator control modules 225. While the preferred embodiment is illustrated as a distributed system, the overall chemical vapor deposition concepts and techniques presented within this invention do not have to be implemented in a distributed fashion. Rather, they may be performed in a linear manner with a single main controller executing all processing steps itself, while still overcoming many of the problems of the prior art system. However, the distributed nature of the preferred embodiment provides significant advantages over a linear system operation, as will be explained.

Modules 210 through 225 are representative of the main processing tasks of the CVD apparatus 10, and there may be other control modules not shown which may be used for other specific tasks noted throughout this specification. Each of the previously described subsystems, including the vaporization subsystem 12, gas-flow-control subsystem 14, process subsystem 16, and exhaust subsystem 18 can include certain components that are operated by the modules 210, 215, 220 and/or 225 of the overall control architecture shown in FIG. 7.

For example, in FIGS. 2a and 2b, the vaporizer subsystem 12 involves, among other tasks, controlling the temperature of reservoir 20, controlling the position of, and therefore the amount of precursor flow from dispensing valve 24, controlling the temperature of the vaporizer 28, and monitoring the pressures within the vaporization chamber 26. Each of these tasks is generally coordinated via software operating within process module controller 205 and is physically carried out by one or more of modules 210 through 225.

Through the distributed nature of the various system components, the process module controller 205 can manage wafer processing for an individual CVD apparatus 10, which requires multiple simultaneous events. If wafer processing for a single CVD apparatus 10 is not too complex, it may be the case that an alternative embodiment of the invention may use a single process module controller to monitor and control more than one CVD apparatus. That is, two physical CVD systems 10 could be controlled by a single process module controller 205, without overloading the processing capacity of the process module controller 205. The preferred embodiment however uses a separate process module controller 205 per CVD apparatus 10. By using distributed processing, certain steps in the overall wafer processing procedure can be performed in parallel with each other which results in more efficient wafer yields and allows real time management of vapor deposition.

Actual process control is accomplished by providing separate control modules 210 through 225 for each of the individual operational components (i.e., valves, temperature monitoring and heating devices, motors, etc.) in each of the subsystems. The modules can be programmed to do specific tasks related to a specific portion of that subsystem's functionality. When given a task, each control module reports back to the process module controller 205 when the task is complete, its status, and/or if the task fails to complete.

For example, all of the temperature control processing may be done in a distributed fashion, such that the high level process module controller 205 can merely instruct one or more specific temperature control modules 210 to set and maintain specific temperatures. The process module controller 205 can then move on to the next main task in the overall wafer processing routine. Achieving and maintaining the set point temperature(s) can then be carried out by the independent temperature control module 210 in a closed loop manner.

An example of a control module is the Intelligent Module No. S7–353 or the S7–355, both manufactured by Siemens Corporation. Such modules may be used for intensive closed-loop type control tasks, while an Intelligent Module No. S7–331, also manufactured by Siemens Corporation, may be used for precision signal conditioning type tasks, such as voltage measurements from capacitance manometers resulting in adjustments in flow control.

These particular control modules used in the preferred embodiment, as well as most other electrical components in the system, operate at low voltage (i.e., 24 Volts AC or DC) in order to prevent injury in the event of a short circuit, and also to prevent interference with vapor deposition. Low voltage operation also allows the system of the invention to operate with 120 Volt or 240 Volt power supplies, or with other international power systems of differing voltages.

Accordingly, all aspects of control, beginning with the vaporization subsystem 12 and ending with the process subsystem 16, are handled by modules which may be independently activated, and which can then handle the given task on their own.

There are, however, instances where modules can provide information or communications directly to other modules to establish adaptive relationships in order to maintain certain process settings. In such instances, these modules can adapt their task without the need for further instructions or tasks from the process module controller 205. That is, two or more modules may establish a relationship such as a master/slave or client/server type relationship, and can adjust themselves accordingly to either back off from a task, or move ahead faster with a task, depending upon the feedback of other inter-related modules involved in adaptative relationships.

For example, a pressure control module 215 may be used to monitor pressure sensor 34, which detects the pressure output from the vaporization chamber 26. The pressure control module 215 can provide direct feedback to a separate flow control module 220 which operates isolation valve 42. If the process module controller 205 initially instructs isolation valve 42, through flow control module 220, to maintain a certain flow of vapor gas, the flow control module 220 can obtain pressure data from the pressure control module 215 that controls pressure sensor 34. This data may be used to determine if there is enough pressure in the delivery conduit to deliver the requested flow. If the pressure is too low or too high, pressure control module 215 may, depending upon the implementation, signal to the process module controller 205 that the task cannot be completed due to lack of pressure, or may, via an established adaptive relationship, signal in real time directly to a vaporization chamber pressure control module in order to increase or decrease vaporization chamber pressure.

In other words, while the overall processing of chemical vapor deposition is controlled in the CVD apparatus by the process module controller 205 with a master control routine, certain control module loops may incorporate data from other modules to adapt or detect changes in other system components, without the need for communication with process module controller 205. Most frequently, this is done where the output of one module directly affects the performance or operation of another module.

Communication between the modules 210 through 225 and the process module controller 205 may be accomplished in a number of ways. Direct Memory Access (DMA) can be used to directly read and write data to commonly accessible memory locations within a shared memory 230, as shown in FIG. 7. A data bus (not shown in FIG. 8), such as, for example, a ProfiBus data bus, which typically operates at 12 Megahertz and uses DB-9 connectors to interface to modules, can interconnect modules 210 through 225 with each other and the process module controller 205, to allow data communications and sharing of information. It is to be understood that common networking and data communications processes and principles are contemplated herein as being applicable to communications between devices, modules and components in this invention.

It is also contemplated in this invention that faults in modules and componentry may occur and therefore, the invention can use redundant or fault tolerant modules, components and processors and can provide swappable dedicated processors for each module 210 through 225 and the process module controller 205. By providing swappable componentry, parts may be replaced without shutting down the entire system. This is beneficial, for example, when an expensive precursor has been preheated and will be damaged if returned to a lower temperature. If a fault occurs, for example, in an elevator control module 215, this module may be replaced or deactivated by another redundant module which may take over for the lost functionality of the failed module. The swapping or redundant failover may be performed without having to stop the wafer deposition process, which saves wafers and reduces precursor waste and reduces system down-time.

Figure 8:
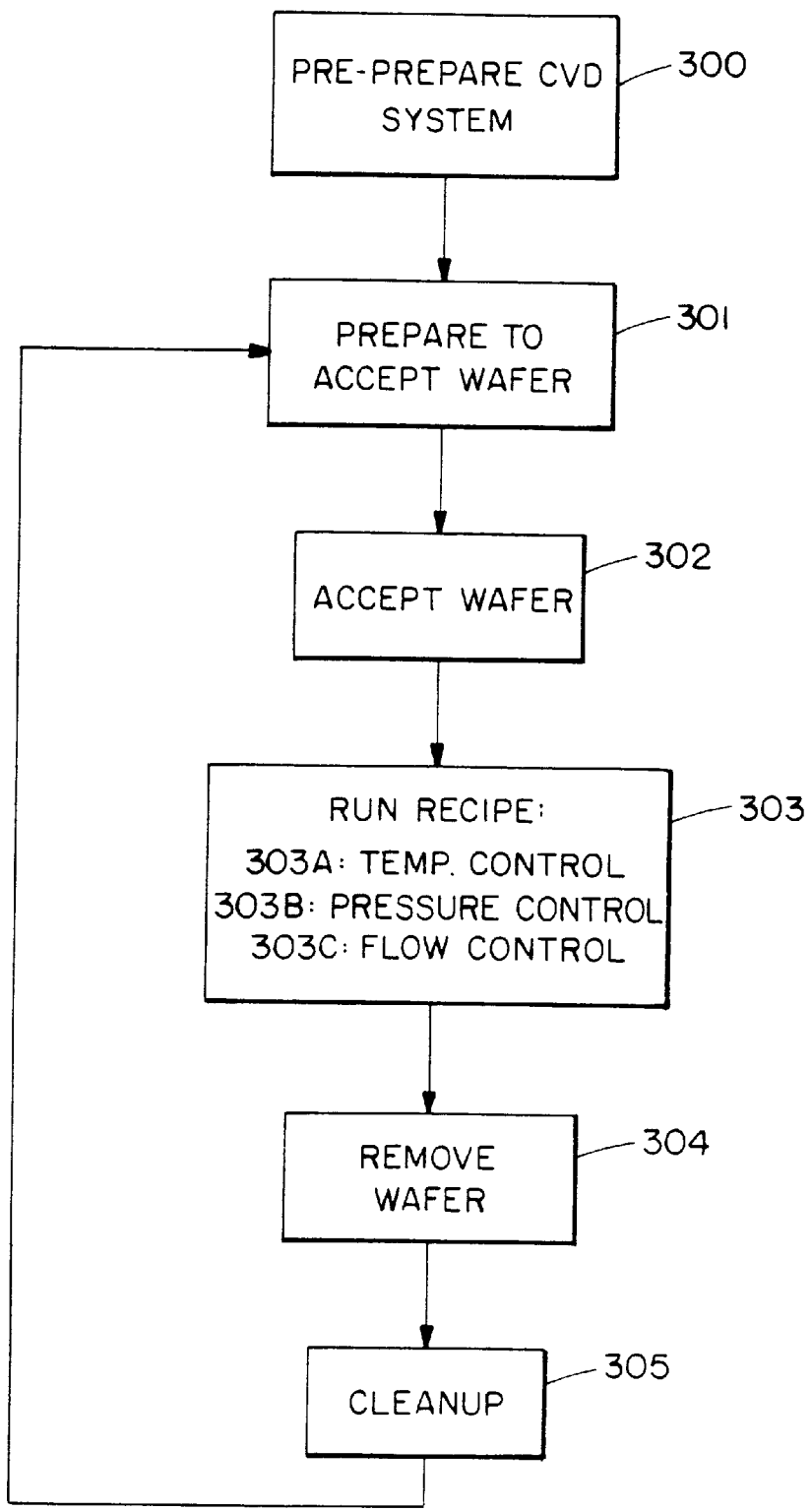
FIG. 8 illustrates the main process control routine according to one embodiment of the invention.

FIG. 8 illustrates a flow chart of the main processing tasks performed by the process module controller 205 from FIG. 7. The steps 300 through 305 are, in a preferred embodiment, implemented in software or firmware and are performed when the CVD apparatus 10 is activated to process wafers. In the preferred embodiment being described, the main process control steps 300 through 305 are wafer-centric in nature. That is, these steps focus mainly upon wafer handling and execution of a process recipe which performs the CVD operation on a particular wafer. Generally, the master routine sets tasks to be performed, sets variables for those tasks and system operation, and instructs the dedicated modules to perform the tasks. In parallel with this main process routine, as will be explained, are a set of other concurrently executing routines which perform other tasks. The sub-processes are necessary for the success of the major process sequence (i.e., steps 300 through 305) of FIG. 8 to complete. The sub-processes, shown in FIGS. 9a, 9b, 10 and 11, are, respectively, the vaporizer sub-process, the vapor phase flow controller sub-process, and the process chamber pressure control sub-process. Other sub-process may exist as well, such as, for example a cleanup process, a housekeeping process, a safety interlock process, and other which are explained herein.

In step 300 of the main process control subroutine of FIG. 8, the CVD apparatus 10 is pre-prepared to accept a wafer. This step includes, for example, the process of pre-heating the pre-cursor in reservoir 20 to the desired temperature and loading a process recipe for the wafer process to be performed by the CVD apparatus 10. Parameters for the process recipe are loaded into memory 230 from an external source, such as, for example, a cluster tool controller (to be explained). The recipe parameters control the various settings such as temperature, pressure, and which vapors and gases are to be processed with the wafer 88.

In a preferred embodiment, there may be as many as ten or more steps that constitute the recipe for wafer processing. Each step allows a user who is processing a wafer to select parameters, such as, for example, the "step number", "step duration" (in seconds), "target process pressure" (in millitorr), "precursor flow rate" (milli-sccm), "reactant flow rate" (milli-sccm) and "wafer temperature" (degrees C). These parameters make up the recipe for a wafer and govern the general temperature, flow, pressure and operation of the CVD apparatus 10. For example, the last parameter, "wafer temperature", is a function of the substrate chuck temperature, since, as will be explained, the wafer is in contact with the substrate chuck for much of the time during processing. Hence, the wafer temperature is a parameter that typically does not change too much from one wafer to another, and may be provided merely for reference for the process recipe.

Step 301 prepares to accept a wafer and signals to an external wafer provider mechanism (e.g., central wafer handler robot arm 134—to be explained in detail later) that the CVD apparatus 10 is ready to accept a wafer. Step 302 then coordinates the movement of the wafer into the process chamber 70 and placement of the wafer on the substrate chuck 74.

Figure 12A:
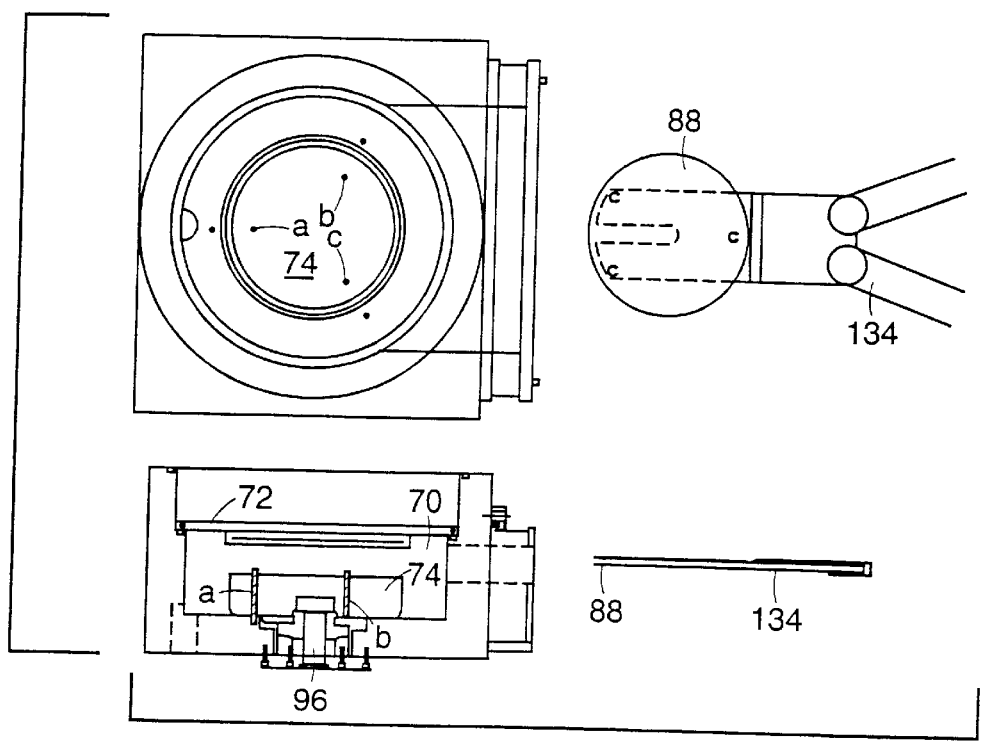
FIGS. 12a through 12d illustrates the operation of inserting a wafer into the process chamber of one embodiment of this invention.
Figure 12B:
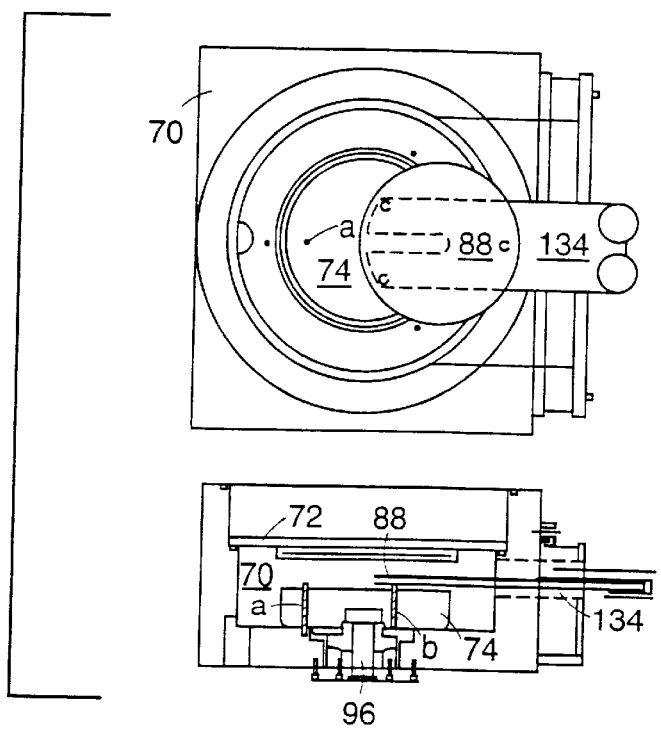
Figure 12C:
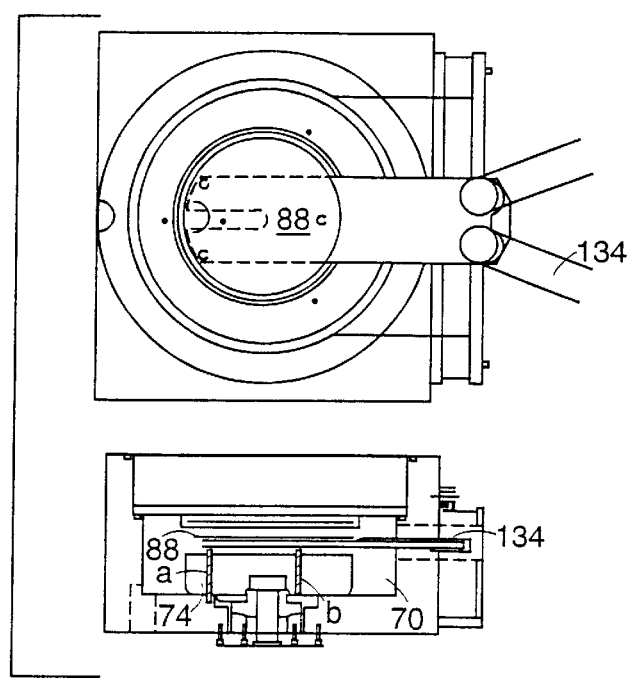
Figure 12D:
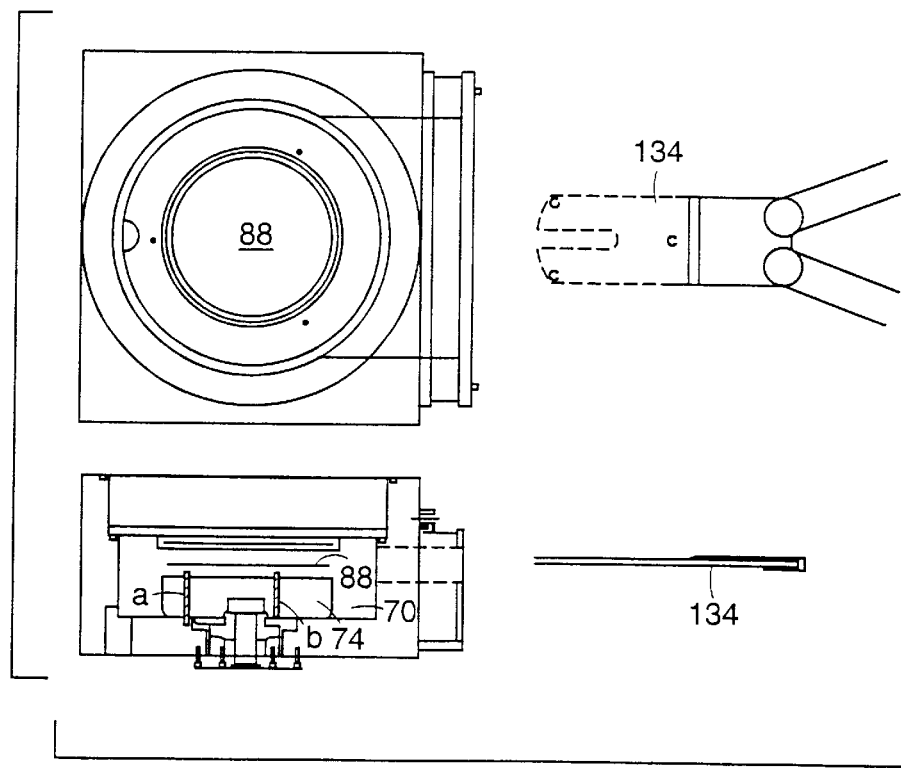

FIGS. 12*a* through 12*d* pictorially illustrate the process of coordinating the movement of the wafer (step 302) into the process chamber 70. Each of these figures includes top and side perspective views of the process chamber 70 area and robot arm 134. In FIG. 12*a*, substrate chuck 74 includes pins 74*a*–*c*, upon which the substrate or wafer 88 is loaded prior to the CVD operation. Before entering the process chamber 70, the wafer 88 rests upon an end effector of robot arm 134 outside of the process chamber 70. As shown in FIG. 12*b*, as the robot arm extends and enters into the process chamber 70, the wafer 88, carried on the end of the robot arm 134, passes over substrate chuck 74 and substrate chuck pins 74*a*–*c* and passes under showerhead 72, which is not in use during the process of accepting a wafer. FIG. 12*c* illustrates the wafer 88 fully inserted into process chamber 70, prior to the retraction of the robot arm 134. The wafer 88 rests on pins 74*a*–*c*, after the robot arm 134 lowers slightly and retracts, as shown in FIG. 12*d*.

Returning to the main processing routine shown in FIG. 8, step 303 then runs the current process recipe that has been programmed into the CVD apparatus 10. The recipe (i.e. the parameters) may be changed between wafers, but once the recipe has been started in step 303, the pre-loaded parameters used for processing do not change for the current wafer 88. As will be explained in FIGS. 9*a*, 9*b*, 10 and 11, running the recipe in step 303 includes aspects of temperature control (step 303*a*), pressure control (step 303*b*) and flow control (step 303*c*). The sub-processes in FIGS. 9*a*, 9*b*, 10 and 11 provide details as to the operation of these aspects of the invention.

In one embodiment of the invention, a recipe loaded into process module controller 205 governs the various processing steps of the wafer according to, for example, the "step duration" parameter. That is, this embodiment can be governed by timers set by parameters that determine, for instance, how long a particular vapor is deposited onto a wafer.

In another embodiment, the sensor sub-system 19 (FIG. 1B) can be used to calculate, measure, or determine the deposition activity on the wafer itself. This information can be used to determine when the next step in the recipe is performed. For example, if a step in the recipe calls for depositing 100 angstroms of copper using a copper vapor onto a wafer, the sensor sub-system, by monitoring the deposition activity, can indicate when this has been completed. As such, the steps in the recipe in this embodiment are not driven so much by timers, as by when processing steps are actually physically completed.

The sensor modules 227, illustrated in the control architecture in FIG. 7 are used to control and provide feedback to process module controller 205 from wafer subsystem 19 as illustrated in FIGS. 1A and 1B. Wafer sensing equipment 87 in wafer subsystem 19, for example, may comprise a laser measurement system that can measure the thickness of any layer of material being deposited onto the wafer 88 during a CVD operation. This layer thickness information may be monitored by sensor modules 227, and when the task of detecting 100 angstroms of copper, for example, is complete, the sensor modules 227 can indicate to the process module controller 205 that the task has been completed. Other wafer sensing equipment that may be used to sense CVD progress may include reflectivity sensors that detect the reflectiveness of the wafer surface. As more material is deposited onto a wafer, the surface may become more or less reflective thus indicating deposition progress. Another sensing device may be an x-ray diffraction system used to measure composition of the wafer surface, thus indicating deposition progress. Those skilled in the art will now readily understand that other common real-time measurement and sensing hardware may used within sensor sub-system 19 to detect and indicate recipe step completion, depending upon the task.

After the recipe is complete, the wafer 88 has been processed by the vapor and gases in the process chamber 70. Step 304 in FIG. 8 then removes the wafer, which is generally the reverse process of that illustrated in FIGS. 12*a* through 12*d*. The robot arm 134 returns and picks up the wafer 88 off of the substrate chuck pins 74*a*–*c*, and carries the wafer 88 out of the process chamber 70. Step 305 then performs cleanup of the CVD apparatus 10, which will also be described in more detail later.

Figure 10:
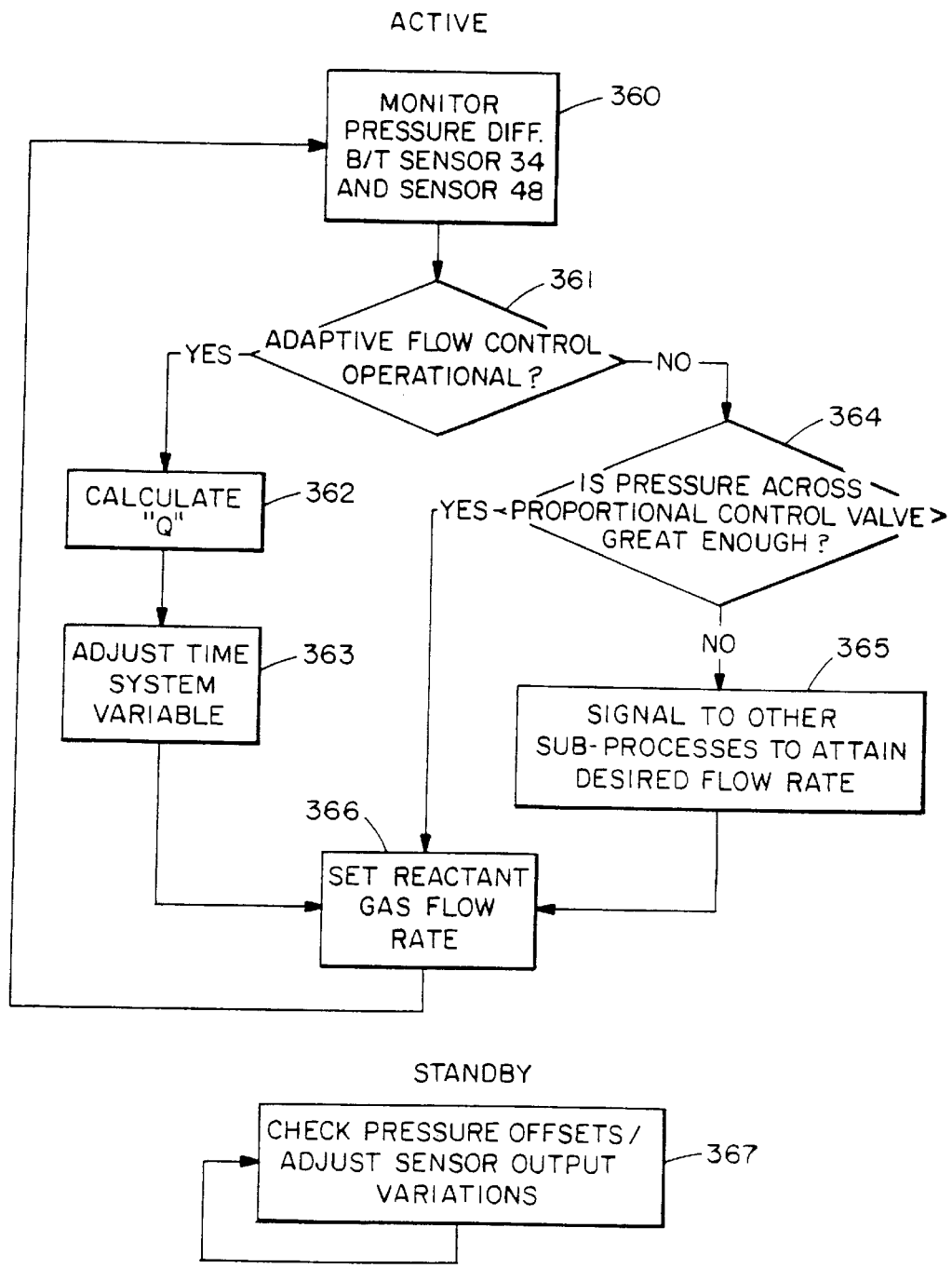
FIG. 10 illustrates the processing performed by the vapor phase flow control sub-process according to one embodiment of this invention.

FIG. 10 illustrates the steps of the vaporizer sub-process that is continually performed during the main control processing steps that execute as explained with respect to FIG. 8. The vaporizer sub-process steps 330 through 334 generally control the vaporization of the precursor in reservoir 20 and the maintenance of pressure at the inlet port 76 to the process chamber 70. The vaporizer sub-process is also responsible for the cleanup of the vaporizer 28 between processing wafers during standby modes.

Figure 9A:
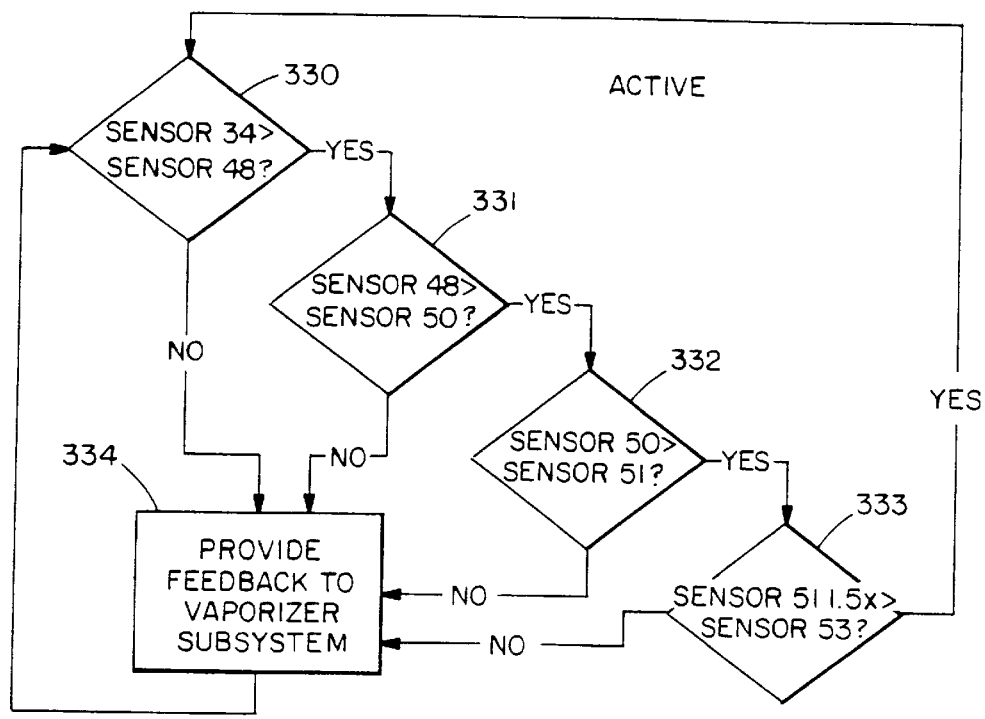
FIGS. 9a and 9b illustrate the operation of the vaporizer sub-process according to one embodiment of this invention.

The vaporizer sub-process shown in FIG. 9*a* is driven primarily by the "vaporizer temperature" parameter that gets loaded during the programming of the recipe into memory 230. This variable drives the temperature setting for all of the other temperature controlled surfaces except the wafer chuck 74 (set by a "wafer chuck temperature" setting) and the funnel temperature (set by a "funnel temperature" setting). The vaporizer pressure largely relies on the pressure control modules 215 which operate and monitor the capacitance manometers 34, 48, 50, 51 and 53 located throughout the system, as previously described.

In step 330, the pressure at pressure sensor 34 must be greater than the pressure at pressure sensor 48. In step 331, the pressure at pressure sensor 48 must be greater than the pressure at pressure sensor 50. In step 332, the pressure at pressure sensor 50 must be greater than the pressure at pressure sensor 51. And finally, in step 333, the pressure measured at pressure sensor 51 must, in this embodiment, be approximately 1.5 times (or more) greater than the pressure measured at pressure sensor 53. If any of these steps 330 through 333 fail, feedback is provided back to the vaporizer subsystem 12 by step 334, at which point the appropriate modules in various subsystems are adjusted so as to maintain the optimum pressure at the wafer, as measured by the difference in pressure between pressure sensors 51 and 53.

Figure 11:
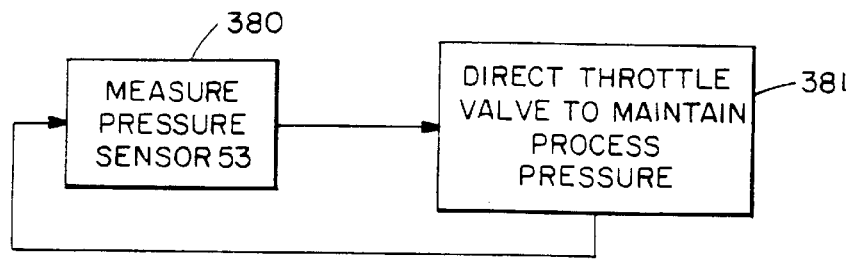
FIG. 11 illustrates a process chamber pressure control sub-process according to this invention.

The recipe parameter "process pressure" is referred to as the "target pressure" since this is the pressure to be maintained by the system at the wafer 88, and is attained in cooperation between the vaporizer sub-process (FIG. 10), the vapor phase flow controller sub-process (FIG. 10) and the process chamber pressure control sub-process (FIG. 11).

Hence, as explained above, during wafer processing, the reservoir 20 deposits small amounts of precursor onto vaporizer 28 which is heated. Each small amount of precursor, which typically flows slowly down the vaporizer 28 inverted cone structure, forms a thin film and resides on the cone for a period of time during vaporizing. As this vaporization occurs, an upward ramp in pressure is measured by capacitance manometer 34. The upper limit of the vapor pressure that is measured by pressure sensor 34 is a function of the temperature of the vaporizer 28 (and the rest of the system) as well as the material used as the precursor. Thus, too high of a temperature may cause the premature chemical decomposition of the precursor prior to its exposure to the wafer 88, and too low of a temperature may result in a low vapor pressure, low flow rate, and low process pressure which results in a low chemical vapor deposition rate.

Figure 9B:
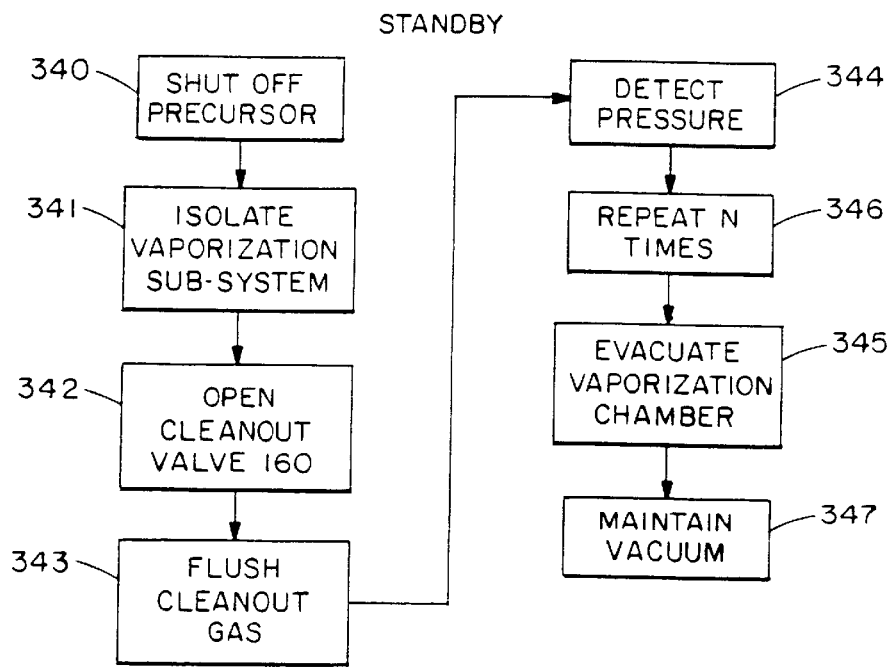

The vaporizer sub-processes in FIGS. 9a and 9b may be in either a processing state or a standby state. The processing state is used, as explained above with respect to FIG. 9a, after a wafer has been accepted. The standby state governs a cleanup process and is shown in FIG. 9b and will be described in conjunction with FIGS. 1A through 1D.

During cleanup of the vaporizer sub-process, in step 340, no precursor is introduced into the vaporization chamber 26. In step 341, isolation valve 42 isolates the entire vaporization subsystem 12 from the other subsystems. Step 342 then fully opens valve 160. Next, in step 343, Argon gas provided from valves 161 and 162 and mass flow controller 165 is introduced into the vaporization chamber 26 until a pressure of approximately 50 torr is measured at pressure sensor 34. Then, step 343 evacuates the pressure in vaporization chamber 26, by opening valve 170 and closing valves 161 and 162, and operating exhaust subsystem 118 to suck out the argon gas. Step 344 then detects a vacuum pressure. Step 345 then repeats steps 343 and 344 N times, where N may be one, two or more times, for example. This N repeat count may be varied, depending upon the properties of substances used. Step 346 then evacuates the vaporization chamber 26 and step 347 maintains the entire volume of vaporization chamber 26 in a vacuum until the vaporization sub-process is instructed to go active to begin processing wafers.

The second sub-process is the vapor phase flow controller sub-process and is illustrated by the processing steps in FIG. 11. During wafer processing, this sub-process ensures that the gas-flow-control subsystem maintains a steady flow of vapor to the process chamber 70, in concert with the variations in pressure that occur at various critical points in the system as explained above during wafer processing. The main objective of this sub-process is to maintain the target mass flow and total aggregated mass flow of vapor to the wafer 88. Unlike traditional mass flow controllers, where pressures are typically 20 psig or more at inlets to the wafer and that flow into a vacuum at or below the wafer, the present invention uses this sub-process to control the flow of vapor in upstream section 78, where the pressure is only one to five torr, and where the "process pressure" is targeted at approximately 800 to 1000 millitorr.

To accomplish this, this sub-process uses the proportional control valve(s) 44 (441 in FIG. 1A, 44 in FIG. 1C) to maintain the appropriate flow and target pressure drop as measured from pressure sensor 34 to pressure sensor 48. Step 360 in FIG. 10 monitors this pressure difference. Step 361 then determines if adaptive flow control is operational. If so, step 362 is executed which calculates the desired flow ("Q") of the vapor being applied to the wafer and adjusts, in step 363, the process time system variable to compensate for any variations from the target pressure experienced during the normal set process time. That is, step 363 lengthens or shortens the check time between determining system pressures, so that the pressure will have the correct time to build based upon the precursor material being used for vapor flow.

In step 361, if adaptive flow control is not being used, step 364 determines if the pressure across the proportional control valve(s) 44 (441 in FIG. 1A, 44 in FIG. 1C) is insufficient to attain the targeted flow rate, and if so, step 365 detects this and signals to the other two sub-processes to attain the desired flow rate by varying appropriate settings.

The vapor phase flow controller sub-process in FIG. 10 is also responsible for controlling modules that set the flow rate of oxidizing reactants via step 366. That is, nitrous oxide, for example, from valves 168 and 169 may be provided as a reactant gas along with the precursor vapor, into the process chamber during flow control of the vapor from the vaporization chamber 26. Step 366 determines the flow rate of any reactant gas by a "reactant flow rate" parameter provided in the recipe. Typically, the reactant flow rate is expressed as a ratio to the flow rate of the vapor from the vaporization chamber 26.

For example, a target pressure that might be typically set is 1.5 to 2.0:1. Since the flow rate of vapor can vary somewhat (as explained above), the flow rate of the reactant from one or more of the mass flow controllers 165, 166 or 167 must also vary in concert with the flow rate of the precursor vapor. Note that in the embodiments shown in the figures, the system is well damped such that variations are on the order of plus or minus 10 percent of the target pressure or flow rate, and are dependent upon variations in the lots of precursor used as received from different suppliers, for example. That is, oscillatory swings may not be noticed within one batch of precursor, but subtle shifts may be observed based upon chemical lots. The sub-process in FIG. 10 helps eliminate these shifts.

The vapor phase flow control sub-process, if in a standby state, as shown in standalone step 367, independently checks any output offsets that might have occurred between pressure sensor 48 and pressure sensor 50, and can use this calculated offset to adjust the pressure sensors apparent output accordingly during subsequent calculations while in active mode. Step 367 can also cross-check pressure measurements of sensors 48 and 50 in standby mode against pressure sensors 34, 51 and 53.

FIG. 11 illustrates the third sub-process, referred to as the process chamber pressure control sub-process, which is associated with maintaining the pressure at the wafer 88. In step 380, the pressure is measured at capacitance manometer 53, which is the pressure in the process chamber 70 below the showerhead 72 at the wafer. Step 381 then directs throttle valve 58 to increase or decrease the pressure as measured in step 380, to maintain the pressure as defined by the parameter "process pressure".

Figure 13:
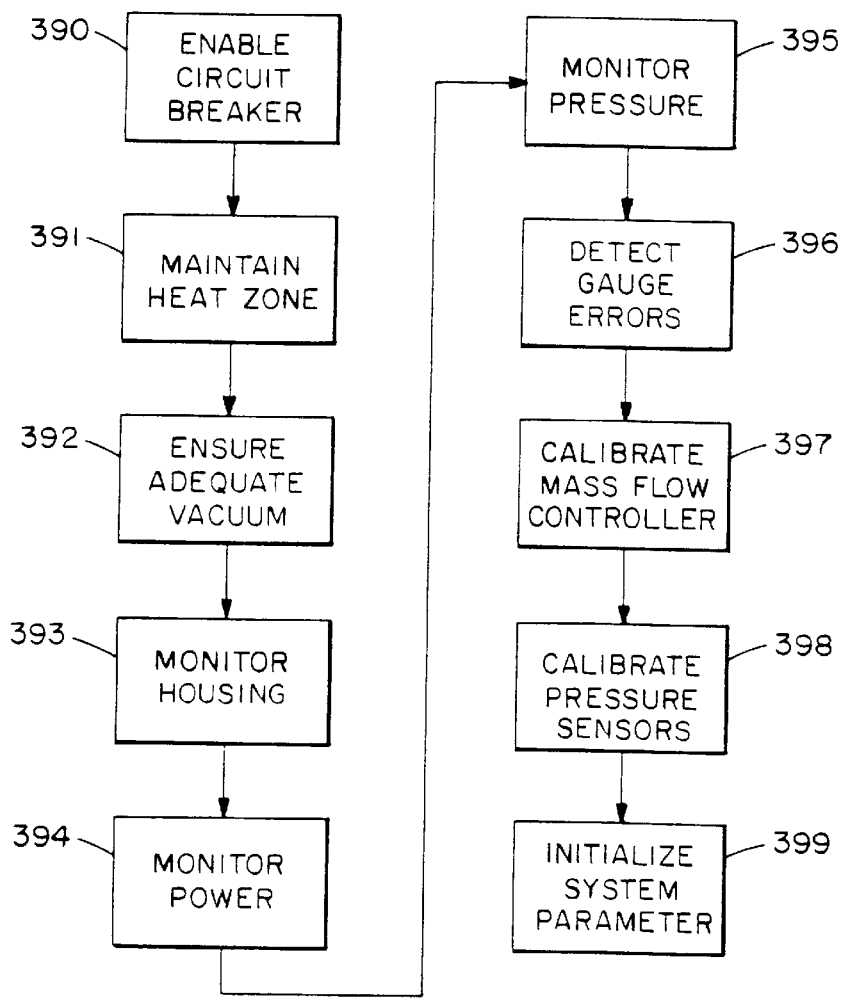
FIG. 13 illustrates the cleanup sub-process according to one embodiment of this invention.

FIG. 13 illustrates the processing steps performed in a cleanup sub-process that runs continuously and which is transparent to the other sub-processes in the system. Upon startup of the CVD apparatus, without a signal of an approaching wafer, the cleanup sub-process is the default process. The cleanup sub-process, in step 390 enables a mechanical circuit breaker to isolate the electrical system components in the event of a power surge. Step 391 maintains all heat zones at the system set points. The parameter "vaporizer temperature" is used as the temperature set point for all heated zones except the reservoir 20 and funnel 22 temperatures, and wafer chuck 74 temperatures. This step can also detect heating wire breaks or shorts. Step 392 ensures that adequate vacuum is present for the process module by testing the vacuum pump control. Step 393 monitors the state of the door and housing covers surrounding the CVD apparatus 10. Steps 394 and 395 monitor system power and pressures, and looks for excursions outside of the normal operating state. Step 396 tracks gauge status and can detect gauge problems and can cross calibrate gauges in the system. Step 397 sets up and calibrates the mass flow controllers 165, 166 and 167. Step 398 cross calibrates the pressure sensors in the system, and step 399 initializes the system parameters to a default state.

Figure 14:
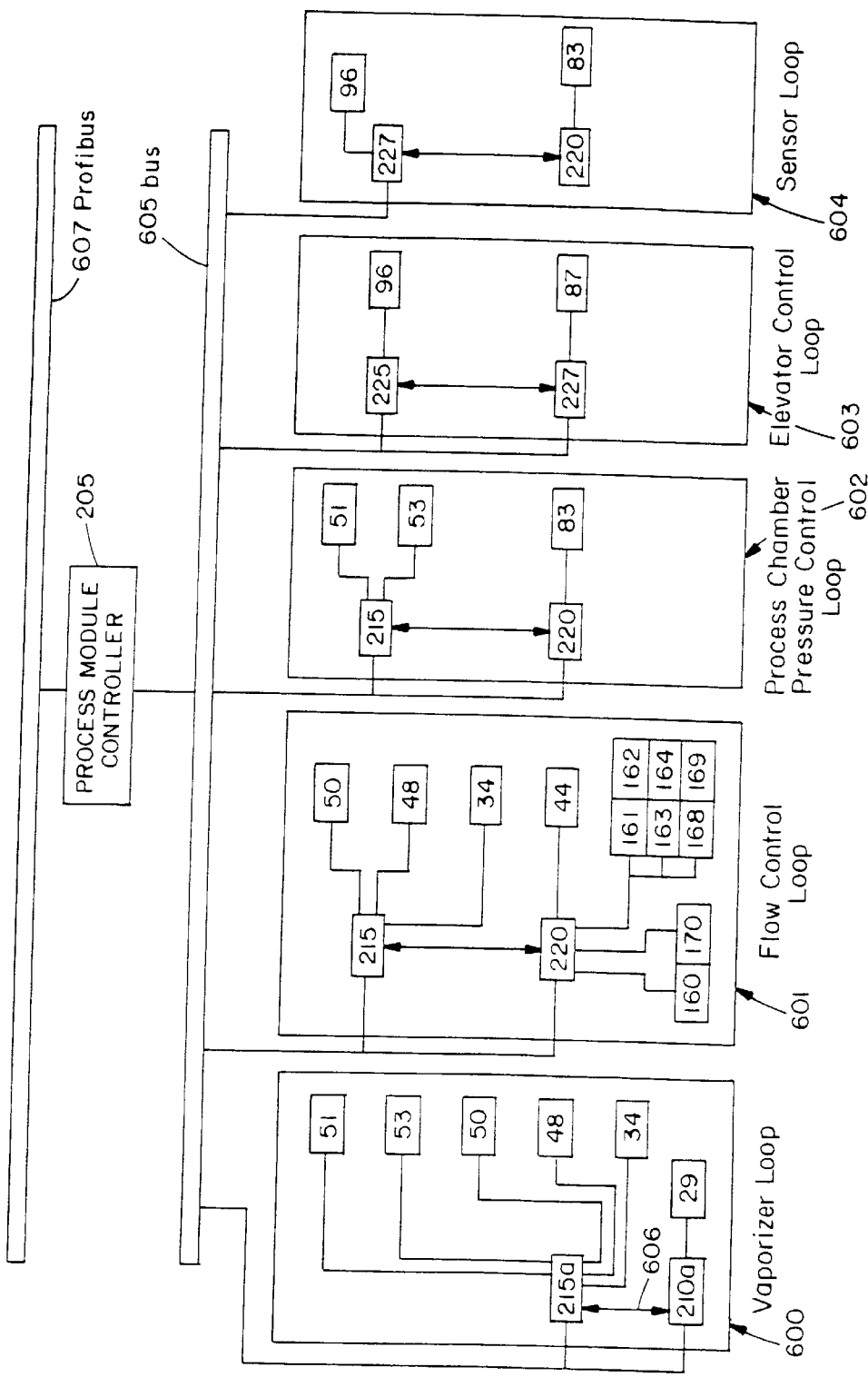
FIG. 14 illustrates an example portion of a schematic showing the closed loops present in a CVD apparatus according to one embodiment of the invention.

FIG. 14 illustrates a schematic architecture of a CVD apparatus of this invention, with each of the previously described sub-processes 600 through 604 of FIGS. 8 through 13 illustrated as a closed loop. Process module controller 205 interfaces with the other hardware components of the system via data bus 605, which carries serial analog and digital commands to the components. Each of the control modules 210 through 227 interfaces to the data bus 605, to communicate with process module controller 205, and in certain instances where adaptive relationship exists, with each other. The process module controller 205 is also connected to a Profibus data bus 607 via which provides deterministic communication with any of a cluster tool controller, a transport module controller, or another process module controller. At higher levels of communication, not shown in FIG. 14, communication is generally via Ethernet, which is non-deterministic.

In the vaporizer loop 600, a pressure control module 215 monitors pressure from capacitance manometers 34, 48, 50, 51, and 53, according to the processing explained above, and can provide data to temperature control module 210 which controls vaporizer heating element 29, in order to provide proper vapor for the system to operate. To interface 606 between pressure control module 215 and temperature control module 210 is an example of a closed loop adaptative relationship, since the temperature is controlled based upon feedback from the pressure control module 215.

In flow control loop 601, which is responsible for maintaining the proper flow of vapor in the system, pressure control module 215 monitors pressure from each of pressure sensors 34, 48 and 50, in order to provide feedback data to flow control module 220, which operates proportional relief valve 44, as well as valves 161 through 164, 168, 169 and 170, in order to provide vapor and reactant gases at a proper flow rate.

Process chamber pressure control loop 602 uses pressure control module 215 to detect pressure at pressure sensors 51 and 53 within the process chamber 70. This pressure information is used in an adaptative relationship between the pressure sensors and the throttle valve 83, operated by the flow control module 220. This closed loop 602 ensures that the pressure in the process chamber is correct during wafer processing by using the throttle relief valve 83 to maintain a continuous flow.

Elevator control loop 603 illustrates the adaptative relationship between the elevator 96, which is operated by elevator control module 225, and the sensor control module 227 which uses sensor equipment 87 to detect how much material has been deposited on a wafer. In this closed loop, which is used when the recipe calls for sensor control, the elevator 96 may be lowered when the sensor equipment 83 detects enough material is present on the wafer. Thus, direct communications is provided between the elevator control module 225 and the sensor control module 227.

The elevator control loop 603 is also related to the sensor loop 604, in that when sensor equipment 96 detects enough deposition material on a wafer, sensor control module 227 notifies flow control module 220 to activate throttle valve 83 in order to turn on the exhaust pump to full power. This empties the process chamber 70 of any leftover vapor so as to immediately stop the deposition process. Sensor loop 604 is thus another example of an adaptive loop, but acts more like a one way trigger since the sensor equipment 96 causes the throttle valve 83 to open when deposition is complete.

In each of the aforementioned loops 600 through 604, the process control module 205 can merely provide the appropriate tasks to each of the control modules 210 through 227. The control modules will execute the given task on their own. By allowing adaptive relationships as explained above, closed loops are formed for the basic underlying sub-processes required for the CVD apparatus to operate efficiently. The process module controller 205 monitors the progress of each closed loop via status data that is provided from each control module. Thus, the process module controller 205 is fully aware of how a specific CVD process is progressing while the process is taking place. In this manner, the process module controller 205 can report to a higher level process, such as the main process taking place within a cluster tool controller 207.

The "processing hierarchy" formed by the lower closed loops and control modules, the intermediate process module controller routine executing on the process module controller 205, and the master cluster tool controller routine executing on the cluster tool controller 120 allows modifications to processing code at one level to have little or no adverse impact on the programs or processes used for other aspects of the CVD process. Moreover, any modifications made to one aspect of the CVD processing, for example, in the flow control loop, which may happen to impact the processing of other loops, will be properly accounted for due to the adaptive relationships and feedback of information between control modules. This hierarchy also allows easy code maintenance and a structured environment where features may be added to one area of CVD processing without having to re-tool or re-code other areas.

In one embodiment, the CVD apparatus 10 is used to deposit a number of leading edge films on a single wafer. This embodiment is designed to operate at low pressure (0.001 to 10.0 torr) and is aimed at the deposition of films with geometries of 0.25 microns or less. The same embodiment, with changes only in temperature and flow control components, will be used in a number of different processes to limit costs and maintenance requirements.

Films that can be deposited by this system include, but are not limited to, the following: aluminum from dimethyl aluminum hydroxide (DMAH), copper from one of the $Cu_x$(hfac)(tmvs, tevs, teovs) precursors, tantalum nitride from a solid precursor such as $TaBr_4$, titanium nitride from a liquid precursor such as tetrakisdiethylamido titanium (TDEAT), tetrakisdimethylamido titanium (TDMAT) or $TiBr_4$, low-k dielectric films from hexasilsesquioxane (HSQ) or a fluorinated tetraethylorthosilicate (TEOS), and tantalum oxide from tantalum pentaethoxide (TAETO) and either ozone or $N_2O$.

As an example of a process performed in accordance with this invention, a tantalum oxide film is deposited on a wafer using liquid TAETO as a precursor and gaseous $N_2O$ as an oxidant. The reservoir 20 is filled with TAETO either with the reservoir 20 in place in the system or with the reservoir 20 temporarily removed for filling. While in the reservoir 20, the TAETO is stored at a temperature above its melting point but below that at which it decomposes. In this embodiment, the TAETO is stored at near room temperature. From the reservoir 20, the TAETO is delivered to the vaporizer 28 through the axial displacement pulse valve in an amount that is just sufficient to generate a workable vapor pressure to deliver to the process chamber 70. The temperature of the vaporizer 28 is tightly controlled, in one embodiment, at 180° C., to vaporize the TAETO as it flows across the surface of the vaporizer 28 without causing the TAETO to thermally decompose.

The vapor pressure of TAETO that is generated in the vaporization chamber 26 is a function of the temperature of the vaporizer 28. Specifically for TAETO, the log of vapor pressure can be calculated with the following formula:

$$\text{Log } P = 11.693 - (4987.12/T),$$

where P is pressure, 11.693 is the estimated coefficient of vaporization, and T is temperature in Kelvin. The vapor pressure of TAETO (measured in torr) is provided in Table 1, below, over a range of temperatures from 100° C. to 220° C.

TABLE 1

| Log P | T in K | T in C | Coefficient | P in torr |
|---|---|---|---|---|
| −1.71324 | 372 | 100 | 11.693 | 0.0194 |
| −1.67729 | 373 | 101 | 11.693 | 0.0210 |
| −1.64155 | 374 | 102 | 11.693 | 0.0228 |
| −1.60599 | 375 | 103 | 11.693 | 0.0248 |
| −1.57062 | 376 | 104 | 11.693 | 0.0288 |
| −1.53644 | 377 | 105 | 11.693 | 0.0291 |
| −1.50044 | 378 | 106 | 11.693 | 0.0316 |
| −1.48583 | 379 | 107 | 11.693 | 0.0342 |
| −1.43100 | 380 | 108 | 11.693 | 0.0371 |
| −1.39666 | 381 | 109 | 11.693 | 0.0401 |
| −1.36229 | 382 | 110 | 11.693 | 0.0434 |
| −1.32822 | 383 | 111 | 11.693 | 0.0470 |
| −1.29429 | 384 | 112 | 11.693 | 0.0508 |
| −1.26056 | 385 | 113 | 11.593 | 0.0542 |
| −1.22700 | 386 | 114 | 11.693 | 0.0593 |
| −1.19361 | 387 | 115 | 11.693 | 0.0640 |
| −1.16040 | 388 | 116 | 11.693 | 0.0891 |
| −1.12736 | 389 | 117 | 11.693 | 0.0746 |
| −1.09449 | 390 | 118 | 11.893 | 0.0804 |
| −1.06178 | 391 | 119 | 11.693 | 0.0867 |
| −1.02924 | 392 | 120 | 11.693 | 0.0935 |
| −0.99687 | 393 | 121 | 11.693 | 0.1007 |
| −0.98466 | 394 | 122 | 11.693 | 0.1085 |
| −0.93262 | 395 | 123 | 11.693 | 0.1168 |
| −0.90074 | 396 | 124 | 11.693 | 0.1257 |
| −0.86902 | 397 | 125 | 11.693 | 0.1352 |
| −0.83745 | 398 | 126 | 11.693 | 0.1454 |
| −0.80605 | 399 | 127 | 11.693 | 0.1563 |
| −0.77450 | 400 | 128 | 11.693 | 0.1880 |
| −0.74371 | 401 | 129 | 11.693 | 0.1804 |
| −0.71277 | 402 | 130 | 11.693 | 0.1937 |
| −0.66199 | 403 | 131 | 11.893 | 0.2080 |
| −0.65136 | 404 | 132 | 11.693 | 0.2252 |
| −0.62088 | 405 | 133 | 11.693 | 0.2394 |
| −0.59055 | 406 | 134 | 11.693 | 0.2667 |
| −0.56037 | 407 | 135 | 11.693 | 0.2752 |
| −0.53033 | 408 | 136 | 11.693 | 0.2949 |
| −0.50045 | 409 | 137 | 11.693 | 0.3159 |
| −0.47071 | 410 | 138 | 11.693 | 0.3383 |
| −0.44111 | 411 | 139 | 11.693 | 0.3621 |
| −0.41168 | 412 | 140 | 11.693 | 0.3876 |
| −0.38235 | 413 | 141 | 11.693 | 0.4148 |
| −0.35318 | 414 | 142 | 11.693 | 0.4434 |
| −0.32416 | 415 | 143 | 11.693 | 0.4741 |
| −0.29527 | 416 | 144 | 11.693 | 0.6067 |
| −0.26652 | 417 | 145 | 11.693 | 0.5414 |
| −0.23791 | 418 | 146 | 11.693 | 0.5782 |
| −0.20943 | 419 | 147 | 11.693 | 0.6174 |
| −0.18110 | 420 | 148 | 11.693 | 0.5590 |
| −0.15289 | 421 | 149 | 11.693 | 0.7032 |
| −0.12482 | 422 | 150 | 11.693 | 0.7502 |

TABLE 1-continued

| Log P | T in K | T in C | Coefficient | P in torr |
|---|---|---|---|---|
| −0.0988 | 423 | 151 | 11.693 | 0.8001 |
| −0.06908 | 424 | 152 | 11.693 | 0.8530 |
| −0.04140 | 425 | 153 | 11.693 | 0.9091 |
| −0.01385 | 426 | 154 | 11.693 | 0.9888 |
| 0.01366 | 427 | 155 | 11.693 | 1.0317 |
| 0.04085 | 428 | 156 | 11.693 | 1.0988 |
| 0.06601 | 429 | 157 | 11.693 | 1.1885 |
| 0.09505 | 430 | 158 | 11.693 | 1.2446 |
| 0.12186 | 431 | 159 | 11.693 | 1.3242 |
| 0.14874 | 432 | 160 | 11.693 | 1.4084 |
| 0.17540 | 433 | 161 | 11.693 | 1.4976 |
| 0.20194 | 434 | 162 | 11.693 | 1.5620 |
| 0.22836 | 435 | 163 | 11.693 | 1.6918 |
| 0.25466 | 436 | 164 | 11.693 | 1.7974 |
| 0.28083 | 437 | 165 | 11.693 | 1.9091 |
| 0.30688 | 438 | 166 | 11.693 | 2.0271 |
| 0.33282 | 439 | 167 | 11.693 | 2.1619 |
| 0.35864 | 440 | 168 | 11.693 | 2.2837 |
| 0.35434 | 441 | 169 | 11.693 | 2.4229 |
| 0.40992 | 442 | 170 | 11.693 | 2.5699 |
| 0.43539 | 443 | 171 | 11.693 | 2.7252 |
| 0.46075 | 444 | 172 | 11.693 | 2.8880 |
| 0.48599 | 445 | 173 | 11.693 | 3.0619 |
| 0.51112 | 446 | 174 | 11.693 | 3.2443 |
| 0.53613 | 447 | 175 | 11.693 | 3.4386 |
| 0.56104 | 448 | 176 | 11.693 | 3.6394 |
| 0.58583 | 449 | 177 | 11.693 | 3.8533 |
| 0.61051 | 450 | 178 | 11.693 | 4.0786 |
| 0.53508 | 451 | 179 | 11.693 | 4.3160 |
| 0.65955 | 452 | 180 | 11.693 | 4.5661 |
| 0.68591 | 453 | 181 | 11.693 | 4.8295 |
| 0.70815 | 454 | 182 | 11.693 | 5.1069 |
| 0.73230 | 455 | 183 | 11.693 | 5.3888 |
| 0.75633 | 456 | 184 | 11.593 | 5.7060 |
| 0.78026 | 457 | 185 | 11.693 | 6.0293 |
| 0.80409 | 458 | 186 | 11.693 | 5.3583 |
| 0.92781 | 459 | 187 | 11.693 | 6.7269 |
| 0.35143 | 460 | 188 | 11.693 | 7.1029 |
| 0.87495 | 461 | 189 | 11.693 | 7.4981 |
| 0.89837 | 462 | 190 | 11.693 | 7.9135 |
| 0.92168 | 463 | 191 | 11.693 | 8.3499 |
| 0.94490 | 464 | 192 | 11.693 | 8.8084 |
| 0.96801 | 465 | 193 | 11.693 | 9.2899 |
| 0.99103 | 466 | 194 | 11.693 | 8.7955 |
| 1.01384 | 467 | 195 | 11.693 | 10.3262 |
| 1.03676 | 468 | 196 | 11.693 | 10.8833 |
| 1.05948 | 469 | 197 | 11.693 | 11.4678 |
| 1.08211 | 470 | 198 | 11.693 | 12.0811 |
| 1.10463 | 471 | 199 | 11.693 | 12.7243 |
| 1.12707 | 472 | 200 | 11.693 | 13.3989 |
| 1.14841 | 473 | 201 | 11.693 | 14.1061 |
| 1.17165 | 474 | 202 | 11.693 | 14.8474 |
| 1.19380 | 475 | 203 | 11.693 | 15.5243 |
| 1.21688 | 476 | 204 | 11.693 | 18.4383 |
| 1.23782 | 477 | 205 | 11.693 | 17.2911 |
| 1.25888 | 478 | 206 | 11.693 | 18.1842 |
| 1.28148 | 479 | 207 | 11.693 | 19.1185 |
| 1.30317 | 480 | 208 | 11.693 | 20.0986 |
| 1.32477 | 481 | 209 | 11.693 | 21.1236 |
| 1.34528 | 482 | 210 | 11.693 | 22.1882 |
| 1.36770 | 483 | 211 | 11.693 | 23.3185 |
| 1.38903 | 484 | 212 | 11.693 | 24.4825 |
| 1.41028 | 485 | 213 | 11.693 | 28.7204 |
| 1.43144 | 486 | 214 | 11.693 | 27.0045 |
| 1.45251 | 487 | 215 | 11.693 | 28.3470 |
| 1.47349 | 488 | 216 | 11.693 | 29.7503 |
| 1.49439 | 489 | 217 | 11.693 | 31.2170 |
| 1.57820 | 490 | 218 | 11.693 | 32.7495 |
| 1.53593 | 491 | 219 | 11.693 | 34.3605 |
| 1.55688 | 492 | 220 | 11.693 | 36.0228 |

With the vaporizer 28 at a temperature of 180° C., a pressure of 4.57 torr is generated in the vaporization chamber 26 without significant decomposition of the TAETO. With this pressure at the inlet to the delivery conduit 40, the process chamber 70 is held at 800 to 900 millitorr. With this pressure differential, about 1.0 sccm of TAETO vapor along with 1.5 sccm N$_2$O are delivered to a wafer heated to about 385° C. Under these conditions, a tantalum oxide film will grow at a rate of approximately 75 to 80 angstroms per minute. The wafer is pre-heated to about the deposition temperature or higher either in a preheat module or, less desirably, in the process chamber 70. Direct thermal coupling between the wafer and the substrate chuck 74 is nominal. Heat is transferred between the wafer and the substrate chuck 74 primarily by way of helium gas flowing between the substrate chuck 74 and the underside of the wafer.

In one embodiment, a target film thickness of 100 angstroms is achieved by running the process for 10 seconds at a reduced flow of reactants to seed the wafer with tantalum oxide. The process is then run for 75 seconds at full flow to build the desired film thickness.

The deposition rate can be either reduced or slightly increased. An increase in the deposition rate may require an increase in the temperature of the vaporizer 28. The temperature of the vaporizer 28, however, should generally be limited to 190° C. for TAETO because there is a risk that the quality of the deposited film will suffer as a result of TAETO degradation.

If the temperature of the vaporizer 28 is reduced to 170° C., the net effect will be a reduction in the rate of TAETO deposition. The maximum pressure available at the inlet to the gas-flow-control subsystem 14 would be reduced to about 2.57 torr. This reduction will nearly halve the possible flow rate and will result in a process pressure of about 450 millitorr. The reduced process pressure will yield a deposition rate of about 22–25 angstrom per minute.

As the TAETO vaporizes, it expands within the principal cylinder 30 and vapor outlet 32 of the vaporization chamber 26. All components, including valves and pressure sensors, within the vaporization chamber 26 and delivery conduit 40 are maintained at the temperature of the vaporizer 28 to prevent the TAETO from condensing. As the pressure in the vaporization chamber 26 is depleted by the flow of vapor through the delivery conduit 40 and into the process chamber 70, the pressure in the vaporization chamber 26 is reestablished by dispensing more TAETO from the reservoir 20 onto the heated vaporizer 28. While the vaporization subsystem 12 can operate continuously to maintain a pressurized supply of TAETO in the vaporization chamber 26, it will preferably maintain a low vapor pressure within the chamber 26 until a demand is signaled by the processor. When no demand is signaled, the vaporization chamber 26 will be purged of TAETO and evacuated.

This cyclic process is established to accommodate the thermal sensitivity of the precursor (in this case, TAETO). The precursor, if held at an elevated temperature for any length of time, will decompose before delivery into the process chamber 70.

Further, with careful selection of precursors, the apparatus and method of this invention allow the sequential deposition of different but complementary materials in the same chamber without moving the wafer. As a result, multiple deposition steps can be performed without wafer movement and the accompanying cycles of pump down, purge, vent up to atmospheric pressure, and wafer heat up.

Complementary processes thus far identified include the following: titanium nitride (TiN) from TiBr$_4$ or TDEAT and ammonia, followed by aluminum from DMAH; tantalum nitride (TaN) from TaBr$_4$ and ammonia, followed by copper from Cu$_I$(hfac) (tmvs); and titanium nitride (TiN) from TiBr$_4$ or TDEAT, and ammonia, followed by aluminum from DMAH, followed by 0.5 atomic percent copper from Cu$_I$ (hfac) (tmvs).

The CVD apparatus 10 is also suitable for depositing barium titanate, barium strontium titanate, strontium bismuth tantalate, and other similar depositions.

The apparatus and method of this invention, and many of the processes, described above, are particularly relevant to semiconductor processing procedures. More particularly, the apparatus and method of this invention are well suited to the deposition of advanced dielectrics and interconnect metals on a wafer.

Figure 15:
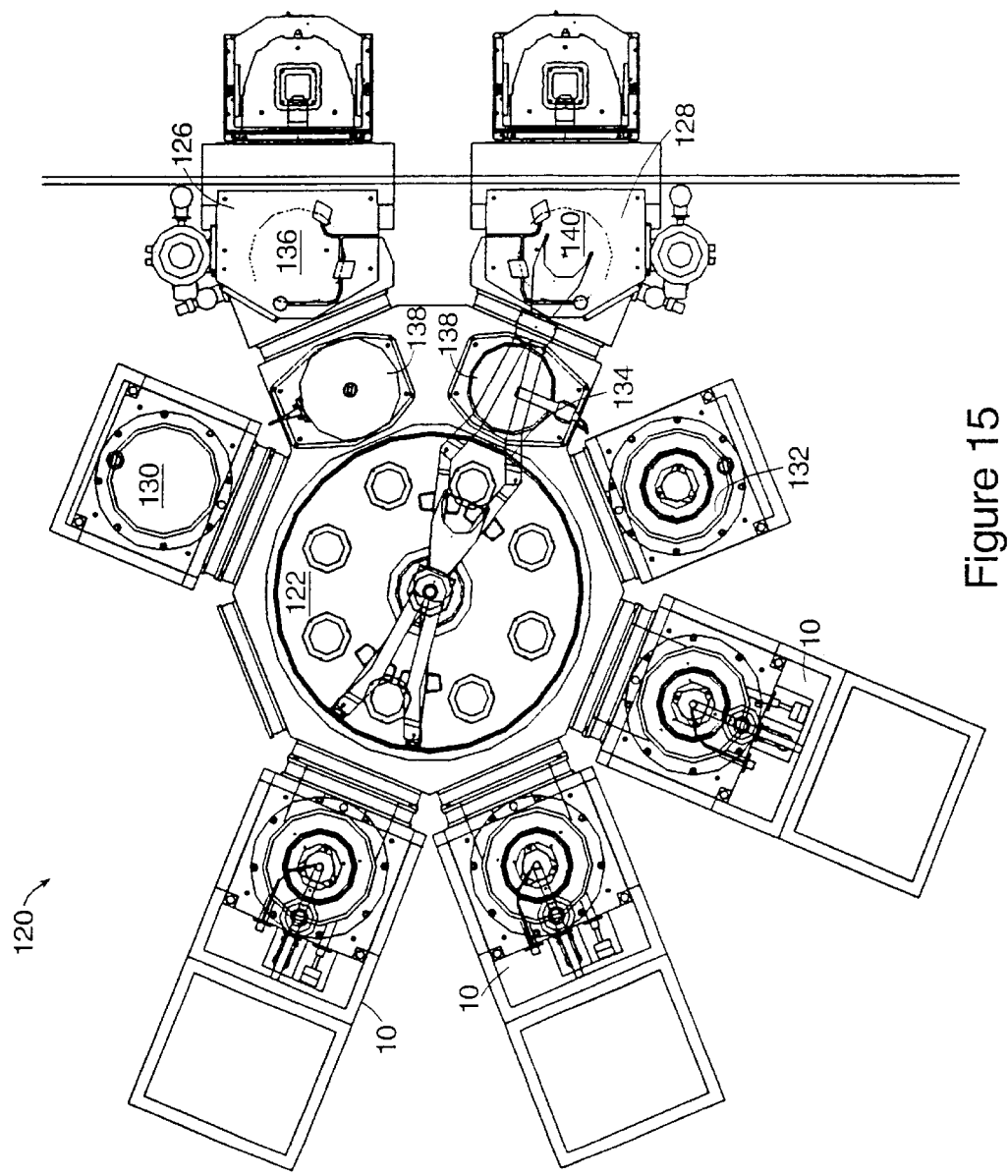
FIG. 15 is an illustration of a cluster tool embodiment of this invention.

A cluster tool 120 for semiconductor processing is illustrated in FIG. 15. The illustrated cluster tool 120 includes a number of process modules assembled around a transport module 122 and interfaced with a central control system. Alternatively, the cluster tool 120 can have an inline, rather than radial geometry of process modules in relation to the transport module 122. One or more of these process modules include a CVD apparatus 10 of this invention. In addition to the CVD apparatus 10 of this invention, the cluster tool 120 includes an entrance load lock 126, an exit load lock 128, a preheat module 130, a cool module 132, and a transport module 122. In the illustrated embodiment, three CVD apparatus 10, which can operate in parallel to enhance throughput, are provided. Alternatively, a variety of other process modules can be provided, e.g., a CVD apparatus 10 in combination with an etch module. These modules can be operated sequentially in series, or in parallel. The cluster tool 120 is designed in accordance with MESC, the standard design architecture adopted by the Semiconductor Equipment and Materials International (SEMI), a trade organization of semiconductor industry suppliers. Accordingly, a variety of other standardized components, such as process modules for different deposition and etch processes, can be readily integrated into the cluster tool 120, as desired.

Each process module in a cluster tool 120 is generally designed to process a single wafer at a time. Typical production requirements are for the tool 120 to process 60 wafers per hour. This rate is achieved by implementing different process steps in separate process modules clustered around the transport module 122. The tool 120, illustrated in FIG. 15, is designed for a 300 mm tantalum oxide process system, which uses an eight-sided transport module 122 typically connected to three tantalum oxide CVD apparatus 10. Optionally, the tool might also accommodate a rapid thermal anneal (RTA) module. In an alternative embodiment, a plurality of cluster tools 120 are interfaced together so that a wafer can be sequentially passed between tools 120 for a series of processing stages without ever removing the wafer from the vacuum established within the cluster tools 120.

The operation of a cluster tool 120 commences with wafers being loaded into an input cassette 136 in an entrance load lock 126. A robot arm 134 (available from Brooks Automation) in the transport module 122 removes one wafer at a time from the input cassette 136 and moves each wafer to an alignment station 138. At the alignment station 138, a standard notch in each wafer is precisely aligned before further processing, eliminating wafer orientation effects within a process module and aiding in process uniformity. Once aligned, the robot arm 134 moves the wafer to a preheat module 130 where the wafer remains for approximately 30 seconds while being heated to 300–500° C. When a CVD apparatus 10 becomes available, the wafer is moved to the process chamber of that CVD apparatus 10 for tantalum oxide deposition. Deposition occurs over a period of approximately 120 seconds. After deposition, the wafer is moved to the cool module 132, where the wafer resides for 30 seconds and is cooled enough to place it in the output cassette 140 in the exit load lock 128.

The process time for tantalum oxide deposition on a wafer is on the order of 120 seconds for a 0.01-micron-thick film on a preheated wafer. Wafer movement from the input cassette 136, to the alignment station 138, to a CVD apparatus 10 and back to an output cassette 140 will consume approximately another ten seconds. The cluster tool 120, with three tantalum oxide CVD apparatus 10, would have a throughput of one wafer every 45 seconds, excluding ramp-up and ramp-down. The tool 120 in this configuration can process up to 75 wafers per hour.

In this context, the deposition process is used to form integrated circuits on the wafer. An integrated circuit is simply a large number of transistors, resistors, and capacitors connected together by metal lines. A general goal is to miniaturize the components to the greatest extent possible.

Figure 16:
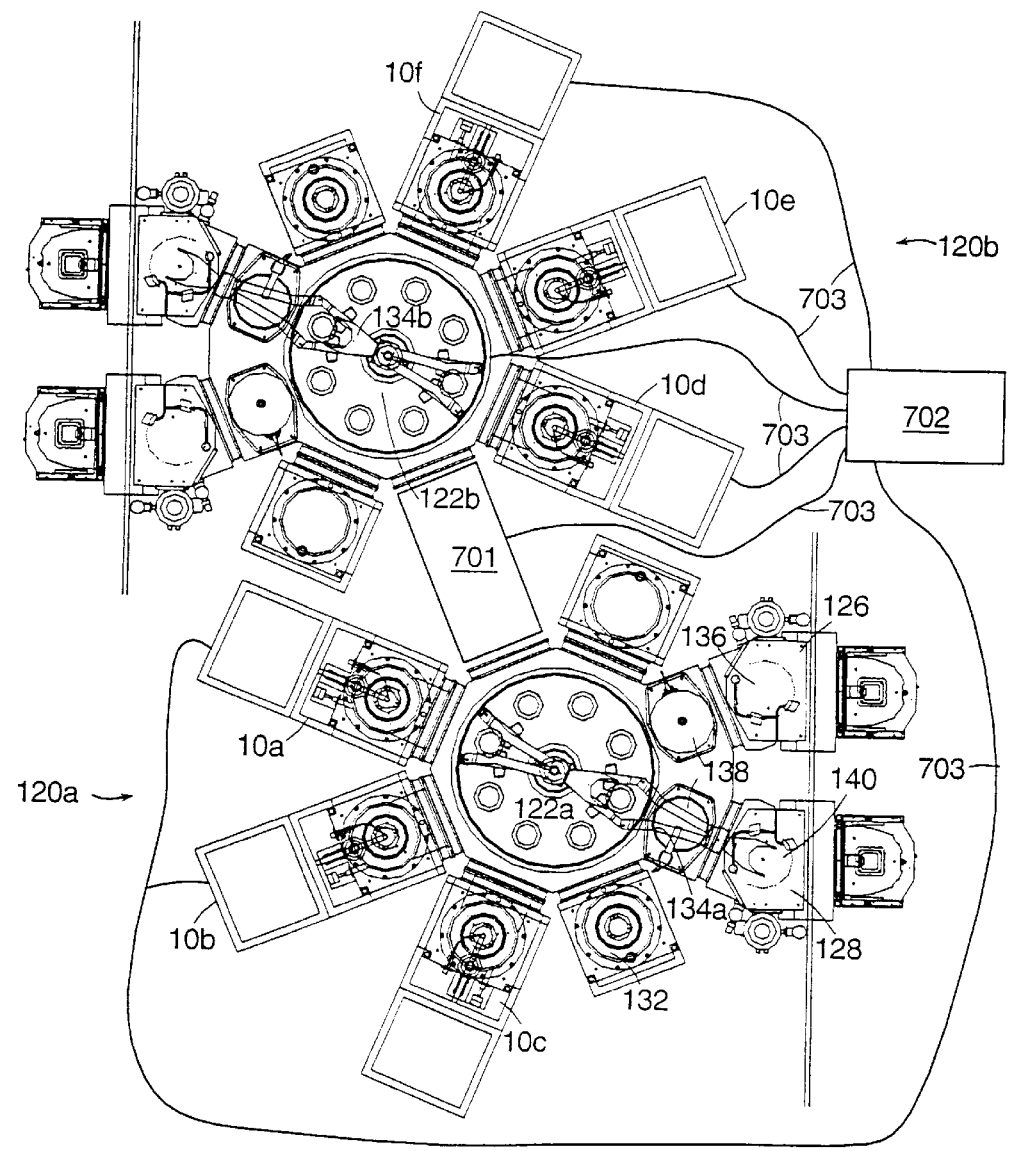
FIG. 16 illustrates multiple cluster tools configured to be controlled by a single factory automation controller according to this invention.

FIG. 16 illustrates a configuration of the invention in which multiple cluster tools 120a and 120b are arranged to process wafer in conjunction with each other. Wafer handoff mechanism 701 can pass wafers from transport module 122a in cluster tool controller 120a to an entire second cluster tool controller 120b. Wafer handoff mechanism 701 may be, for example, a conveyor-belt apparatus which transports the wafers 88 from the robot arm 134a to the second robot arm 134b of transport module 122b. Alternatively, the wafer handoff mechanism 701 can be accomplished by physically passing individual wafers 88 from robot arm 134a to robot arm 134b.

The CVD apparatus 10a–c in FIG. 16 may be used for a certain processing of the wafers, and when complete, the wafers can be transported, through wafer handoff mechanism 701, to the second configuration of CVD apparatus 10d–f and secondary transport module 122b for a second type of processing. During the entire processing of wafers by the configuration in FIG. 16, the wafers may be maintained under a vacuum and may be maintained at a relatively constant temperature. Since the cluster tools 120a and 120b are an entirely closed system, wafers experience reduced exposure to contamination and outside atmosphere while being processed.

The large scale wafer processing illustrated in FIG. 16 is referred to herein as a factory automation wafer processing system. According to one aspect of factory automation processing in this invention, the entire set of CVD apparatus 10a–f, transport modules 122a and 122b, and cluster tools 120a and 120b may all be controlled by a single factory automation controller 702 which handles all scheduling of wafer processing from beginning to end. Factory automation controller 702 contains a master central processing unit that governs the operation of each cluster tool 120a and 120b. Data bus 703 interconnects each CVD apparatus 10a–f with factory automation controller 702.

Figure 17:
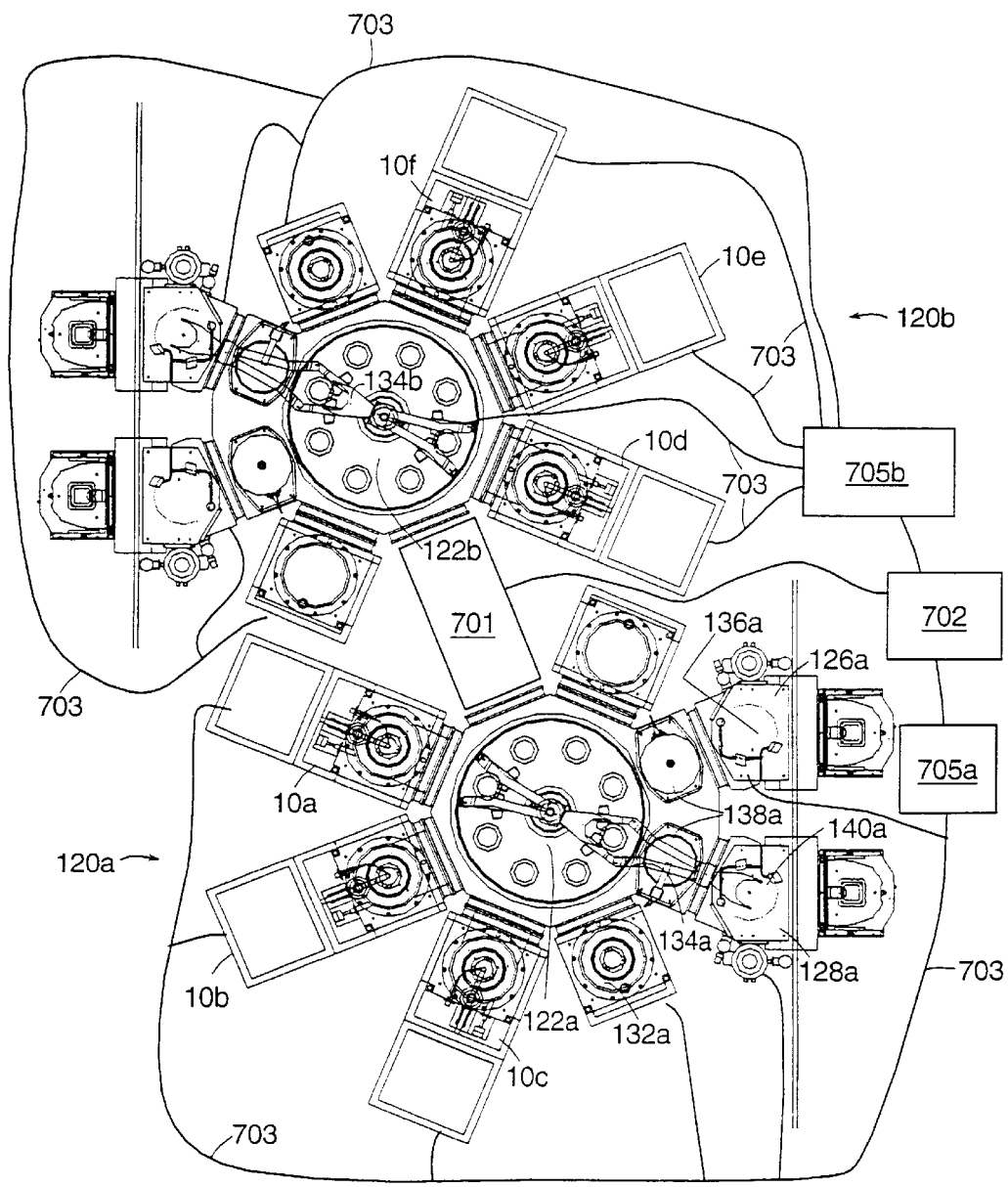
FIG. 17 illustrates multiple cluster tools, each controlled by separate cluster tool controllers which are in turn controlled by a factory automation controller according to this invention.

FIG. 17 illustrates an alternative configuration for a factory automated CVD processing system. In FIG. 17, the individual components (i.e., CVD apparatus 10, preheat modules 130, cooling modules 132, transport modules 122) of each cluster tool 120a and 120b are controlled by separate cluster tool controllers 705a and 705b. Factory automation controller 702 controls each cluster tool controller 705a and 705b, and can control wafer handoff mechanism 701.

In yet another alternative embodiment, one of the cluster tool controllers, for example, 120a, can control the wafer handoff mechanism 701 and can signal to the other cluster tool 120b that it has completed its wafer processing and that wafer are on route via wafer handoff mechanism 701 and should be accepted by robot arm 134b.

Each of these arrangements are shown by way of example only, and the invention is not limited to only two cluster tools in the factory automation configurations shown in FIG. 16 and 17. Rather, there may be many cluster tools arranged in any number of ways, each having a cluster tool controller which is controlled by one or more master factory automation controllers. By distributing processing as shown in these examples, real-time wafer processing can be accomplished from beginning to end in a more efficient, clean, and timely manner.

Figure 18:
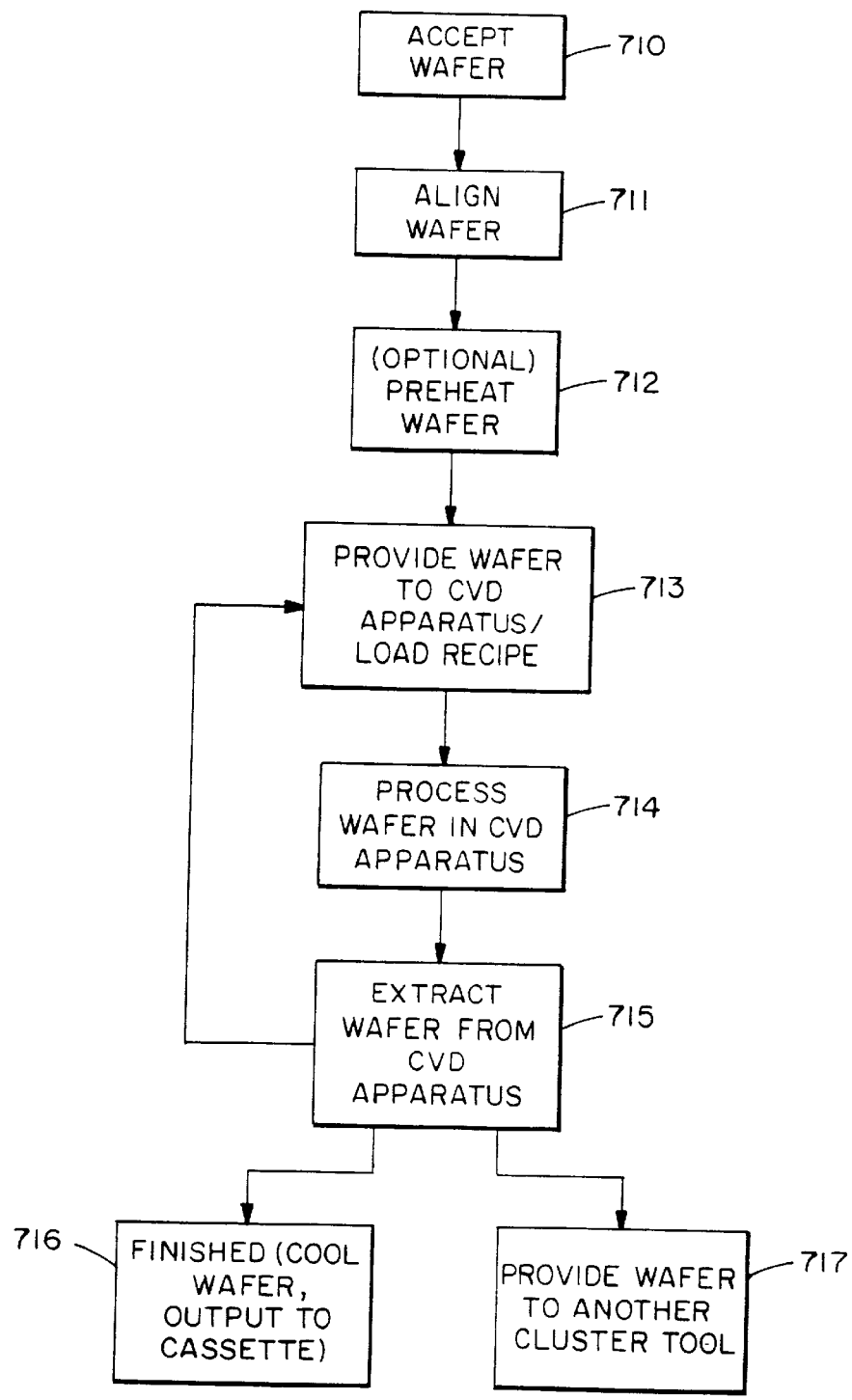
FIG. 18 illustrates an example of the processing steps performed by a cluster tool controller according to one embodiment of this invention.

FIG. 18 illustrates an example of the typical steps involved in controlling a single cluster tool 120a via cluster tool controller 705a, as illustrated in FIG. 17. In step 710, robotic arm 134a accepts a wafer from the input cassette 136a, which is attached to the entrance load lock 126a. The robotic arm 134, in step 711, then aligns the wafer on the armature itself.

Wafer alignment on the robotic arm 134 is performed at the alignment station 138, where a notch in the side of the wafer is mechanically aligned with a reference indicator.

Once the wafer is correctly oriented, in step 712, which is an optional step, the wafer may be pre-heated in pre-heat module 130. Heating the wafer brings the wafer up to a temperature at or near the operating or substrate chuck temperature of the first CVD apparatus 10 that will accept the wafer. Next, the robotic arm 134, in step 713, places the wafer into one of the CVD apparatus 10a–c of the current cluster tool controller 120a for CVD processing in step 714, as explained above. While three CVD apparatus 9a through 10c are illustrated in FIG. 16, the invention is not limited to three, and there may be one, two, three or many more such system all accessible by a single robotic arm 134. After the wafer has completed CVD processing in step 714 in CVD apparatus 9a, in step 715, the robotic arm extracts the wafer. Next, the wafer either moves to the next CVD apparatus (i.e., back to step 713), or finishes processing (step 716) by being cooled in cool module 132 and exiting the cluster tool 12a via output cassette 140, or the wafer is passed to another cluster tool 120b via wafer handoff mechanism 701 (step 717). Generally, wafer processing repeats until the correct sequence of heating, CVD processing and cooling has been performed, as dictated by the wafer processing program executing in cluster tool controller 705a controlling the operation of cluster tool 120a.

New generations of semiconductor processing attempt to build this structure using the latest technologies and equipment to create the smallest possible features. Accordingly, it is intended that the transistors, wires, capacitors, and resistors occupy as little space on the wafer surface, as possible, providing more devices per wafer while limiting costs. As the size of features decreases, new materials are often needed to maintain the proper conductivity of the finer wires and the capacitance values of the smaller-area capacitors.

The apparatus of this invention are specifically intended for the deposition of thin films of metals, dielectric layers used as liners for these metals, low-k interlayer dielectric layers, and capacitor dielectrics (denoted as high-k) required for 0.25 micron or smaller linewidth processes. The processes can be used to form integrated circuits with clock speeds of 400 MHZ or faster and 256 Mbit or more DRAM.

Semiconductor deposition processes that can be performed with a cluster tool 120 incorporating a CVD apparatus 10 of this invention include the deposition of high-k capacitor dielectrics such as tantalum oxide; the deposition of liner layers that serve as barriers and adhesions promoters, like titanium nitride, a liner used for aluminum, and tantalum nitride, a copper liner; and the deposition of copper metal for interconnects.

Further, the methods and apparatus of this invention are suitable for the deposition of stacked gate dielectrics, which include successively deposited layers of extremely thin films (on the order of 15 angstroms for each film) of two different dielectrics to minimize gate capacitance. Stacked dielectric gates may generally be used in devices with geometries of less than 0.15 microns and in devices with geometries of up to 0.25 microns where an increase in speed beyond 400 MHZ is needed.

Further still, the methods and apparatus of this invention offer advantages in the processing of stacked dielectrics, where sequential deposition of two different dielectrics is generally required. The design of a precursor delivery system, in accordance with this invention, allows deposition of both materials in the same process chamber. As a result, the wafer will not be exposed to random oxidation, which would destroy the gate. Further, because the wafer need not be moved, the system is expected to have an intrinsically higher throughput than existing systems.

Other materials that can be suitably deposited on semiconductor wafers with an apparatus and method of this invention include aluminum, aluminum/copper (an alloy with reduced liner requirements), barium titanate (a potential high-k dielectric film), and barium strontium titanate (another high-k dielectric film).

Other suitable applications for the CVD apparatus and methods of this invention include processing of flat panel displays and coated drill bits. Further still, the apparatus and methods of this invention can be used to deposit optical dielectric coatings, anti-reflection coatings, and coatings to reduce friction and wear.

While this invention has been particularly shown and described with references to preferred embodiments thereof, those skilled in the art will understand that various changes in form and details may be made therein without departing from the scope of the invention as defined by the appended claims.

What is claimed is:

1. A method for depositing a thin film over a substrate surface, comprising the steps of:
   dispensing a precursor from a reservoir into a vaporization chamber having a first heater the reservoir having a first sensor to monitor a condition of the precursor;
   measuring a vapor pressure of a vaporized precursor;
   controlling a rate at which the precursor is vaporized in response to the measured vapor pressure including controlling a dispense rate of precursor in the reservoir;
   controlling a flow rate of the vaporized precursor with a flow controller, the flow controller having a second heater, a second sensor, a laminar flow element and a third sensor;
   delivering the vaporized precursor into a process chamber from the flow controller along a heated delivery conduit; and
   depositing the vaporized precursor in a thin film at a surface of the substrate.

2. The method of claim 1, wherein the precursor is dispensed from a reservoir onto a vaporizer at a rate set as a function of the measured pressure.

3. The method of claim 1 wherein further comprising measuring vapor flow between the vaporization chamber and the process chamber with a pair of capacitance manometers positioned at opposite ends of the laminar flow element.

4. The method of claim 1, further comprising the step of measuring vapor pressure in the process chamber.

5. The method of claim 1, further comprising measuring a vapor pressure in the process chamber on opposite sides of a showerhead.

6. The method of claim 5, further comprising the step of controlling vapor flow through passages in the showerhead by regulating the openings of valves positioned at the passages.

7. The method of claim 2, further comprising measuring the vapor pressure of the precursor in the vaporization chamber.

8. The method of claim 2 further comprising delivering the vapor generated by the vaporizer such that the vapor passes substantially undiluted through the process chamber.

9. The method of claim 1, further comprising fabricating an integrated-circuit on the surface of the substrate.

10. A method of forming a film on a substrate comprising the steps of:
    measuring a vapor pressure of a fluid precursor; measuring a temperature of the precursor in a reservoir;
    dispensing the precursor from the reservoir into a heated vaporization chamber;
    vaporizing the dispensed precursor;
    regulating flow of the vaporized precursor to a process chamber along a heated delivery conduit with a flow controller having a heater, a first sensor, a laminar flow element and a second sensor;
    heating a substrate in the process chamber; and
    depositing the vaporized precursor at a surface of the substrate to form a film of material on the surface.

11. The method of claim 10, further comprising the step of providing conformal coverage of a substrate surface by depositing the precursor on the surface of the substrate with the rate of deposition being limited by the rate of reaction at the surface of the substrate.

12. The method of claim 10, further comprising the step of raising and lower a substrate chuck to regulate vapor flow through the process chamber.

13. The method of claim 10, further comprising:
    controlling the rate of gas flow between the vaporization chamber and the process chamber in response to the measured gas flow to form a layer on the substrate.

14. The method of claim 10, further comprising the steps of inducing reaction of the vaporized precursor and depositing the precursor or a component of the precursor on the substrate in the process chamber.

15. The method of claim 10, further comprising dispensing the precursor from a reservoir onto a vaporizer.

16. The method of claim 10, further comprising measuring a gas flow between the vaporization chamber and the process chamber with a pair of capacitance manometers positioned at opposite ends of a laminar flow element.

17. The method of claim 10, further comprising the step of measuring pressure in the process chamber.

18. The method of claim 10, further comprising measuring a pressure in the process chamber on opposite sides of a showerhead.

19. The method of claim 18, further comprising the step of controlling gas flow through passages in the showerhead by regulating the openings of valves positioned at the passages.

20. The method of claim 10, further comprising measuring pressure in a vaporization chamber and dispensing a precursor onto a vaporizer such that the dispensing step is controlled as a function of the measured pressure in the vaporization chamber.

21. The method of claim 10, further comprising heating the delivery conduit with a heater on a valve.

22. The method of claim 15, further comprising generating an electromagnetic field in a substrate chuck positioned in the process chamber.

23. The method of claim 15, wherein the vapor generated by the vaporizer passes substantially undiluted through the process chamber.

24. A method for depositing a film over a substrate, comprising the steps of:
dispensing a first precursor from a first reservoir into a first vaporization chamber, the first reservoir having a first sensor to monitor a condition of the precursor;
measuring a vapor pressure of a first vaporized precursor;
controlling a rate at which the first precursor is vaporized in response to the measured vapor pressure;
dispensing a second precursor from a second reservoir in a second vaporization chamber, the second reservoir having a second sensor to monitor a condition of the precursor;
measuring a second vapor pressure of a second vaporized precursor;
controlling a rate at which the second precursor is vaporized in response to the second measured vapor pressure;
controlling a flow rate of the first precursor using a first heated flow controller having a first laminar flow element;
controlling a flow rate of the second precursor using a second heated flow controller having a second laminar flow element;
providing a system controller connected to the first reservoir and the second reservoir, the first vaporizer and the second vaporizer, and the first heated flow controller and the second heated flow controller to control flow of the first vaporized precursor and the second vaporized precursor into a process chamber;
delivering the first vaporized precursor into the process chamber along a second heated delivery conduit;
delivering the second vaporized precursor into the process chamber along a second heated delivery conduit; and
depositing the first and second vaporized precursors to produce material at a surface of the substrate.

25. The method of claim 24, wherein the precursor is dispensed from a reservoir onto a vaporizer at a rate set as a function of the measured pressure.

26. The method of claim 24 wherein further comprising measuring vapor flow between the first vaporization chamber and the process chamber with a pair of capacitance manometers positioned at opposite ends of the laminar flow element.

27. The method of claim 24, further comprising the step of measuring vapor pressure in the process chamber.

28. The method of claim 24 further comprising measuring a vapor pressure in the process chamber on opposite sides of a showerhead.

29. The method of claim 28, further comprising the step of controlling vapor flow through passages in the showerhead by regulating the openings of valves positioned at the passages.

30. The method of claim 25 further comprising measuring the vapor pressure of the precursor in the vaporization chamber.

31. The method of claim 25 further comprising delivering the vapor generated by the vaporizer such that the vapor passes substantially undiluted through the process chamber.

32. The method of claim 1, further comprising fabricating an integrated-circuit on the surface of the substrate.

* * * * *